(12) United States Patent
Ye et al.

(10) Patent No.: US 9,252,326 B2
(45) Date of Patent: Feb. 2, 2016

(54) LIGHT EMITTING DEVICE HAVING A PLURALITY OF LIGHT EMITTING CELLS

(75) Inventors: Kyung Hee Ye, Ansan-si (KR); Dae Sung Cho, Ansan-si (KR); Won Cheol Seo, Ansan-si (KR); Young Eun Yang, Ansan-si (KR); Sum Geun Lee, Ansan-si (KR)

(73) Assignee: Seoul Viosys Co., Ltd., Anan-si (KR)

( * ) Notice: Subject to any disclaimer, the term of this patent is extended or adjusted under 35 U.S.C. 154(b) by 1008 days.

(21) Appl. No.: 13/009,284

(22) Filed: Jan. 19, 2011

(65) Prior Publication Data

US 2011/0222285 A1    Sep. 15, 2011

(30) Foreign Application Priority Data

Mar. 15, 2010 (KR) .......................... 10-2010-0022819
Apr. 30, 2010 (KR) .......................... 10-2010-0040651

(51) Int. Cl.
*F21S 4/00* (2006.01)
*H01L 33/08* (2010.01)
(Continued)

(52) U.S. Cl.
CPC ............ *H01L 33/08* (2013.01); *H05B 33/0821* (2013.01); *H01L 27/156* (2013.01); *H01L 33/38* (2013.01); *H01L 33/62* (2013.01); *H01L 2924/0002* (2013.01)

(58) Field of Classification Search
CPC combination set(s) only.
See application file for complete search history.

(56) References Cited

U.S. PATENT DOCUMENTS 6,870,196 B2    3/2005    Strip
7,417,259 B2    8/2008    Sakai et al.

(Continued)

FOREIGN PATENT DOCUMENTS

CN    101000739    7/2007
KR    10-2007-0018297    2/2007

(Continued)

OTHER PUBLICATIONS

Preliminary Notice of First Office Action issued on Nov. 25, 2013 in Taiwanese Patent Application No. 100106225.

*Primary Examiner* — Hrayr A Sayadian
(74) *Attorney, Agent, or Firm* — H.C. Park & Associates, PLC

(57) ABSTRACT

The present invention relates to a light emitting device including at least three pairs of half-wave light emitting units, each pair including a terminal of a first half-wave light emitting unit connected to a terminal of a second half-wave light emitting unit, the terminals having the same polarity, a polarity of the connected terminals of one half-wave light emitting unit pair being opposite to the polarity of the connected terminals of an adjacent half-wave light emitting unit. The light emitting device also includes at least two full-wave light emitting units each connected to adjacent pairs of half-wave light emitting units. The half-wave light emitting units and the full-wave light emitting units each have at least one light emitting cell, the half-wave light emitting units each have a first terminal and a second terminal, the full-wave light emitting units each have a third terminal having the same polarity as the first terminal and a fourth terminal having the same polarity as the second terminal, and the third terminal of each full-wave light emitting unit being connected to the second terminal of adjacent half-wave light emitting units and the fourth terminal of each half-wave light emitting unit being connected to the first terminal of adjacent half-wave light emitting units.

35 Claims, 24 Drawing Sheets

(51) Int. Cl.
*H05B 33/08* (2006.01)
*H01L 27/15* (2006.01)
*H01L 33/38* (2010.01)
*H01L 33/62* (2010.01)

(56) References Cited

U.S. PATENT DOCUMENTS

2008/0017871 A1    1/2008    Lee et al.
2008/0136347 A1*  6/2008    Lin et al. ...................... 315/250
2009/0322241 A1   12/2009   Onushkin et al.

FOREIGN PATENT DOCUMENTS

| KR | 10-2010-0003033 | 1/2010 |
| TW | 200423808 | 11/2004 |
| TW | 200808121 | 2/2008 |
| TW | 11304274 | 12/2008 |
| TW | M354294 | 4/2009 |
| TW | M373080 | 1/2010 |

* cited by examiner

LIGHT EMITTING DEVICE HAVING A PLURALITY OF LIGHT EMITTING CELLS

CROSS-REFERENCE TO RELATED APPLICATIONS

This application claims priority from and the benefit of Korean Patent Application No. 10-2010-0022819, filed on Mar. 15, 2010, and Korean Patent Application No. 10-2010-0040651, filed on Apr. 30, 2010, which are hereby incorporated by reference for all purposes as if fully set forth herein.

BACKGROUND OF THE INVENTION

1. Field of the Invention

The present invention relates to a light emitting device, and more particularly, a light emitting device having a plurality of light emitting cells.

2. Discussion of the Background

A light emitting diode, which is an electroluminescence semiconductor device, emits light by recombining electrons with holes. Light emitting diodes have been prevalently used as display devices and backlights. Light emitting diode display devices may have smaller power consumption and longer lifespan than incandescent lamps or fluorescent lamps, such that light emitting diodes may replace incandescent lamps and fluorescent lamps and expand its use field to general lighting. An attempt to improve the light emitting output per chip area of a high-voltage light emitting diode and an attempt to improve reliability of the light emitting diode have been continuously conducted.

Generally, a light emitting diode may be driven and emit light when a forward current flows through it, such that the light emitting diode may be repeatedly turned on and off according to the direction of current under an alternating current (AC) power supply. Therefore, when the light emitting diode is directly connected to the AC power supply, it may not continuously emit light and may be easily damaged by reverse current.

In order to solve this problem, a light emitting diode directly connected to a high-voltage AC power supply is disclosed in U.S. Pat. No. 7,417,259, issued to Sakai, et. al. In addition to this, light emitting diodes having various structures have been developed.

According to U.S. Pat. No. 7,417,259, the light emitting diode arrays are formed by two-dimensionally connecting the light emitting diodes in series using metal wirings on an insulating substrate, such as a sapphire substrate. The two light emitting diode arrays are connected on the substrate in anti-parallel, such that they continuously emit light when current is applied from an AC power source.

Meanwhile, according to U.S. Pat. No. 7,417,259, one array is driven for a half period of the AC power supply and the other is driven for next half period thereof. That is, half the light emitting cells in a light emitting diode are driven while a phase of the AC power supply is changed. Therefore, the utilization of the light emitting cells does not exceed 50%.

Meanwhile, a light emitting diode configured by disposing an array of light emitting cells connected in series between two nodes of a bridge rectifier made by using light emitting cells on the substrate and driven by an AC power supply is disclosed in U.S. Patent Application Publication No. 2008/0017871, applied for by Lee, et al. According to U.S. Patent Application Publication No. 1008/0017871, the light emitting cell array connected to the bridge rectifier performs full-wave light emission regardless of the phase of the AC power supply, thereby making it possible to increase the utilization of the light emitting cells.

However, when the number of light emitting cells connected to the bridge rectifier is increased, a high reverse voltage may be applied to specific light emitting cells in the bridge rectifier, such that the light emitting cells in the bridge rectifier may be damaged, thereby damaging the light emitting diode. Generally, when the reverse voltage applied to the light emitting cells exceeds 3 Vf, the possibility of damaging the light emitting cells may be increased. In order to prevent the light emitting cells from being damaged, the number of light emitting cells in the array of the light emitting cells connected to the bridge rectifier may be reduced. In this case, however, it may be difficult to provide a light emitting diode driven under a high-voltage AC power supply. Alternatively, the reverse voltage may be reduced by increasing the number of light emitting cells forming the bridge rectifier. However, this may degrade the utilization of the light emitting cells.

SUMMARY OF THE INVENTION

Exemplary embodiments of the present invention provide a light emitting device capable of increasing the utilization of light emitting cells.

Exemplary embodiments of the present invention also provide a light emitting device capable of improving the alignment and connection structure of light emitting cells in order to minimize reverse voltage applied to a single light emitting cell while increasing the utilization of the light emitting cells.

Exemplary embodiments of the present invention also provide a light emitting device capable of increasing the number of light emitting cells driven under a specific driving voltage.

Exemplary embodiments of the present invention also provide a light emitting device in which a plurality of light emitting cells are aligned on a light emitting diode chip having a quadrangle shape in order to increase the light emitting area of the light emitting device while the light emitting cells are effectively interconnected.

Additional features of the invention will be set forth in the description which follows, and in part will be apparent from the description, or may be learned by practice of the invention.

An exemplary embodiment of the present invention discloses a light emitting device including at least three pairs of half-wave light emitting units, each pair including a terminal of a first half-wave light emitting unit connected to a terminal of a second half-wave light emitting unit, the terminals having the same polarity, a polarity of the connected terminals of one half-wave light emitting unit pair being opposite to the polarity of the connected terminals of adjacent half-wave light emitting unit. The light emitting device also includes at least two full-wave light emitting units each connected to adjacent pairs of half-wave light emitting units. The half-wave light emitting units and the full-wave light emitting units each have at least one light emitting cell, the half-wave light emitting units each a have first terminal and a second terminal, the full-wave light emitting units each have a third terminal having the same polarity as the first terminal and a fourth terminal having the same polarity as the second terminal, and the third terminal of each full-wave light emitting unit being connected to the second terminal of adjacent half-wave light emitting units and the fourth terminal being connected to the first terminal of adjacent half-wave light emitting units.

An exemplary embodiment of the present invention also discloses a light emitting device including a substrate, at least one first electrode pad arranged on the substrate, at least one second electrode pad arranged on the substrate, a plurality of half-wave light emitting cells arranged on the substrate, a plurality of full-wave light emitting cells arranged on the substrate, a plurality of connectors electrically connecting the half-wave light emitting cells and the full-wave light emitting cells, wherein the plurality of half-wave light emitting cells include at least two first branch half-wave light emitting cells and at least one first merge half-wave light emitting cell, the plurality of full-wave light emitting cells each are electrically connected to the at least two first branch half-wave light emitting cells and the at least one first merge half-wave light emitting cell, and the at least two first branch half-wave light emitting cells, the at least one first merge half-wave light emitting cell, and the full-wave light emitting cells being configured to emit light during a first half period of alternating current (AC) power when an AC power is supplied to the first electrode pad and the second electrode pad.

An exemplary embodiment of the present invention also discloses a light emitting device including a first row including a first light emitting cell and a second light emitting cell, a second row including a third light emitting cell and a fourth light emitting cell, a third row including a fifth light emitting cell and a sixth light emitting cell, and a first column including a seventh light emitting cell and an eighth light emitting cell.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
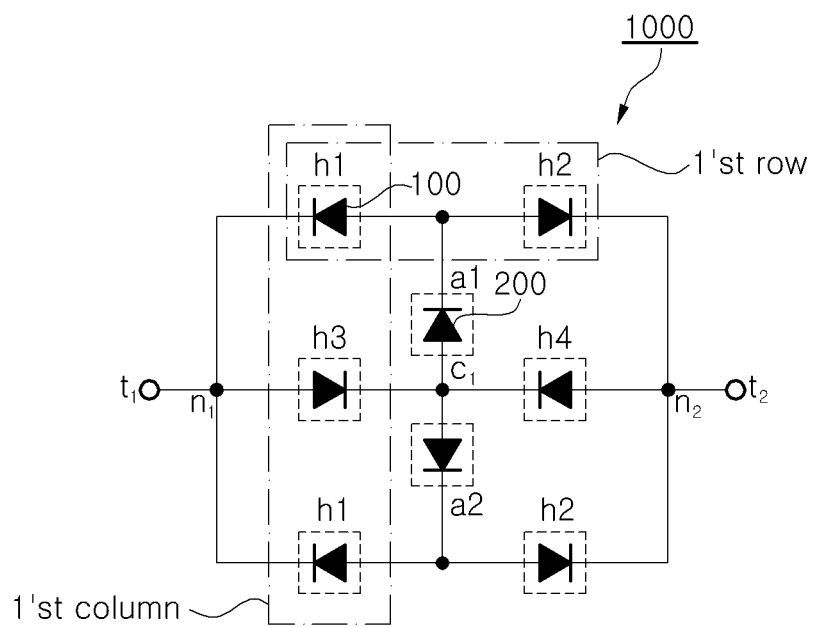
FIG. 1 is a circuit diagram of a light emitting device according to a first exemplary embodiment of the present invention.

Hereinafter, exemplary embodiments of the present invention will be described with reference to the accompanying drawings. The exemplary embodiments of the present invention to be described below are provided by way of example so that the idea of the present invention can be sufficiently transferred to those skilled in the art to which the present invention pertains. Therefore, the present invention may be modified in many different forms and it should not be limited to the embodiments set forth herein. In the drawings, the length and the thickness of a layer may be exaggerated for convenience. Like reference numerals denote like elements throughout the specification.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

In the exemplary embodiments of the present invention, a half-wave light emitting cells implies a light emitting cell to which the forward voltage is applied for a half period of an AC power supply and a reverse voltage is applied for another half period thereof or a reverse voltage is applied for a half period of an AC power supply and the forward voltage is applied for another half period thereof. A full-wave light emitting cells implies a light emitting cell to which the forward voltage is applied for the entire period of an AC power supply. In addition, a branch half-wave light emitting cell implies a half-wave light emitting cell on a current path through which a driving current flows by being divided, and a merge half-wave light emitting cell implies a half-wave light emitting cell on a current path through which at least a portion of a driving current flows by being merged.

FIG. 1 is a schematic circuit diagram showing a light emitting device 1000 according to a first exemplary embodiment of the present invention.

Referring to FIG. 1, the light emitting device 1000 includes three pairs of half-wave light emitting units h1, h2, h3, and h4 electrically connected on a single substrate by wirings and two full-wave light emitting units a1 and a2. In this case, "a pair" of half-wave light emitting unit implies that the same terminals of two half-wave light emitting units are electrically connected to each other, while facing each other, as described below.

In this configuration, each of the half-wave light emitting units h1, h2, h3, and h4 has at least one light emitting cell 100 and each of the full-wave light emitting units a1 and a2 has at least one light emitting cell 200. When a plurality of light emitting cells are included in these light emitting units h1, h2, h3, h4, a1, and a2, the light emitting cells in the light emitting units may be connected to each other in series. However, for simplification, FIG. 1 shows that only one light emitting cell 100 or 200 is included in each light emitting unit, as is also shown in the following drawings.

The half-wave light emitting units h1, h2, h3, and h4 each have a first terminal (for example, an anode terminal) and a second terminal (for example, a cathode terminal) and the full-wave light emitting units a1 and a2 each have a third terminal (for example, an anode terminal) having the same polarity as the first terminal and a fourth terminal (for example, a cathode terminal) having the same polarity as the second terminal. These first to fourth terminals are electrically connected to each other by wirings to electrically connect a plurality of light emitting units, such that a circuit as shown in FIG. 1 is formed.

In this configuration, the "anode terminal" and "cathode terminal" each are both terminals of the light emitting cells through which current is input and output to and from each light emitting cell. If the terminals are connected by wirings, the anode terminal may be a p-type semiconductor layer (not shown), a transparent electrode layer formed on the p-type semiconductor layer, or an electrode pad formed on the p-type semiconductor layer or the transparent electrode layer, and the cathode terminal may be an n-type semiconductor layer (not shown) of the light emitting cell or an electrode pad formed on the n-type semiconductor layer, for example.

The first terminals of the half-wave light emitting units h1, h2, h3, and h4 may be a p-electrode pad, the second terminals thereof may be an n-electrode pad, and the third terminals of the full-wave light emitting units a1 and a2 may be a p-electrode pad and the fourth terminals thereof may be an n-electrode pad, for example. However, the present invention is not limited thereto but the wirings may be directly formed at the positions of the electrode pads, without being separately formed.

Referring back to FIG. 1, the three pairs of half wave light emitting units (i.e., half-wave light emitting units of a first row, a second row, and a third row) are positioned between first and second nodes $n_1$ and $n_2$ and each pair includes the half-wave light emitting units of which the terminals having the same polarity are electrically connected to each other. The terminals of one pair have the opposite polarity to the terminals of another pair adjacent thereto.

In addition, the full-wave light emitting units are electrically connected between a pair of half-wave light emitting units h1 and h2 and the other one pair of half-wave light emitting units h3 and h4, that is, the full-wave light emitting units are electrically connected to the adjacent two pairs of half-wave light emitting units. That is, the first full-wave light emitting unit a1 is connected between the pairs of half-wave light emitting units of the first and second rows and the second full-wave light emitting unit a2 is connected between the pairs of half-wave light emitting units of the second and third rows.

In this case, the third terminals of the first and second full-wave light emitting units a1 and a2 are electrically connected to each other at a central node $c_1$ and the second terminals of the pair of half-wave light emitting units h3 and h4 of the second row are electrically connected to each other at the central node $c_1$.

That is, the third terminals of the first and second full-wave light emitting units a1 and a2 are electrically connected to the second terminals of the pair of half-wave light emitting units h3 and h4, while the fourth terminals of the first and second full-wave light emitting units a1 and a2 each are electrically connected to the first terminals of the other two pairs of half-wave light emitting units h1 and h2. In other words, each terminal of the first and second full-wave light emitting unit is electrically connected to the terminals of the half-wave light emitting units having the same polarity electrically connected to each other, respectively. Thus the third terminal of each full-wave light emitting unit is connected to the second terminal of each adjacent half-wave light emitting unit and the fourth terminal of each full-wave light emitting unit is electrically connected to the first terminal of each adjacent half-wave light emitting unit.

For example, the third terminal of the first full-wave light emitting unit a1 is electrically connected to the second terminals of the half-wave light emitting units h3 and h4 of the second row and the fourth terminal of the first full-wave light emitting unit a1 is electrically connected to the first terminals of the half-wave light emitting units h1 and h2 of the first row.

Further, the terminals of ends of both sides of one of the adjacent two pairs of half-wave light emitting units are electrically connected to the terminals of ends of both sides of the other one pair, respectively. For example, the first terminals of the half-wave light emitting units h3 and h4 of the second row are electrically connected to the second terminals of the other half-wave light emitting units h1 and h2 of the first and third rows at the first and second nodes $n_1$ and $n_2$, respectively.

Meanwhile, the light emitting device 1000 may have terminals $t_1$ and $t_2$ for connecting to the external power supply, wherein the terminals $t_1$ and $t_2$ may be electrically connected to the first and second nodes $n_1$ and $n_2$, respectively. In this case, the terminal $t_1$ is connected to the first terminal of the half-wave light emitting unit h3 and the second terminals of the half-wave light emitting units h1, and the terminal $t_2$ is connected to the first terminal of the half-wave light emitting unit h4 and the second terminals of the half-wave light emitting units h2.

Hereinafter, the operation of the light emitting device 1000 will be described with reference to FIG. 2A and FIG. 2B.

Figure 2A:
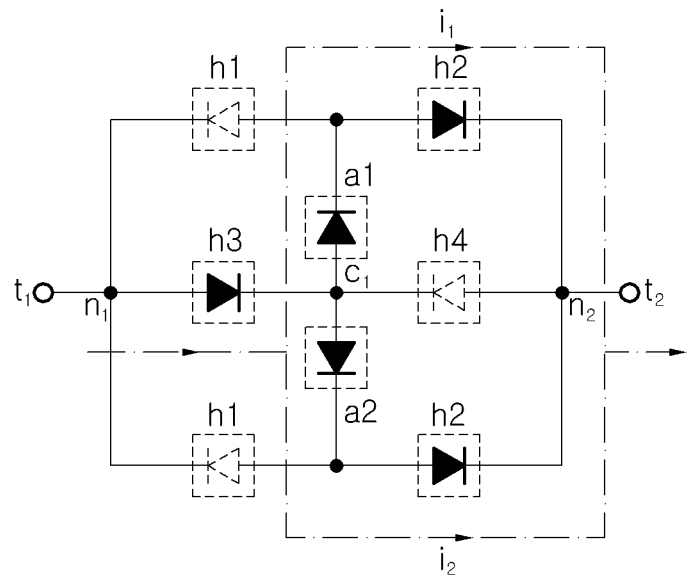
FIG. 2A and FIG. 2B are diagrams for explaining an operation of the light emitting device shown in FIG. 1.
Figure 2B:
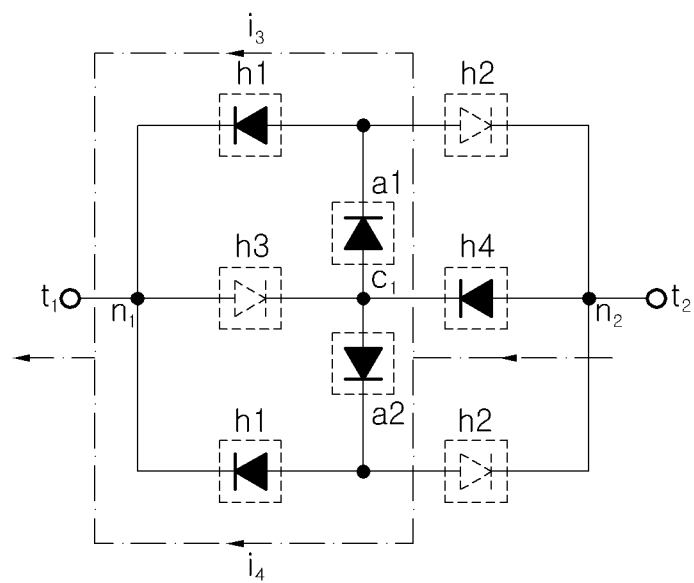

FIG. 2A and FIG. 2B show the light emitting units driven for a positive half period (hereinafter, referred to as first period) and a negative half period (hereinafter, referred to as a second period) of an alternating current (AC) voltage and the corresponding current path.

First, as shown in FIG. 2A, when a positive voltage is applied to the terminal $t_1$ (i.e., first period), current paths $i_1$ and $i_2$ are formed through which current flows into a terminal $t_2$ via the half-wave light emitting unit (h3, second row) of which the first terminal is connected to the terminal $t_1$, the first and second full-wave light emitting units a1 and a2, and the half-wave light emitting units (h2, first row and third row) from the terminal $t_1$, such that light is emitted from the half-wave light emitting units h2 and h3 and the full-wave light emitting units a1 and a2. That is, light is emitted from five of eight light emitting units, such that the utilization of the light emitting units becomes 5/8=62.5%. In this case, the "utilization" of the light emitting unit implies the ratio of the number of the driving light emitting units to the number of light emitting units configuring the entire light emitting device 1000.

Next, as shown in FIG. 2B, when a positive voltage is applied to the terminal $t_2$ (i.e., second period), current paths $i_3$ and $i_4$ are formed through which current flows into a terminal $t_1$ via the half-wave light emitting unit (h4, second row) of which the first terminal is connected to the terminal $t_2$, the first and second full-wave light emitting units a1 and a2, and the half-wave light emitting units (h1, first row and third row) from the terminal $t_2$, such that light is emitted from the half-wave light emitting units h1 and h4 and the full-wave light emitting units a1 and a2. That is, light is emitted from five of eight light emitting units, such that the utilization of the light emitting units becomes 5/8=62.5%.

That is, the half-wave light emitting units h2 and h3 and all the full-wave light emitting units a1 and a2 emit light while a positive voltage is applied to the terminal $t_1$ and the other half-wave light emitting units h1 and h4 and all the full-wave light emitting units a1 and a2 emit light while a positive voltage is applied to the terminal $t_2$. Therefore, the half-wave light emitting units h1 and h4 and the half-wave light emitting units h2 and h3 alternately emit light during the first and second periods according to the phase of the AC power supply and the full-wave light emitting units a1 and a2 emit light during both periods regardless of the change in the phase of the AC power supply.

Therefore, according to the first exemplary embodiment of the present invention, the utilization of the light emitting units can be increased to 62.5%, as compared to a reverse polarity alignment (50%) or a bridge alignment (generally, 60%) that is an AC driving type light emitting diode alignment according to the related art. Further, when all the half-wave light emitting units have a single light emitting cell, the utilization of the light emitting cell may be maximized.

Next, according to the first exemplary embodiment of the present invention, the reverse voltage applied to the half-wave light emitting units h1, h2, h3, and h4 will be described.

The forward voltage is applied to the half-wave light emitting units h2 and h3 and the full-wave light emitting units a1 and a2 and the reverse voltage is applied to the half-wave light emitting units h1 and h4, during a first period at which the half-wave light emitting units h2 and h3 and the full-wave light emitting units a1 and a2 emit light by applying a positive voltage to the terminal $t_1$.

In this case, the reverse voltage that is applied to the half-wave light emitting unit h1 equals the sum of the forward voltage applied to one full-wave light emitting unit a1 or a2 connected to the first terminal thereof and the forward voltage applied to one half-wave light emitting unit h3 connected to the second terminal thereof. Similarly, the reverse voltage applied to the half-wave light emitting unit h4 is equal to a sum of the forward voltage applied to one full-wave light emitting unit a1 or a2 and the forward voltage applied to one half-wave light emitting unit h2. That is, when the forward voltage of each full-wave light emitting unit a1 and a2 and each half-wave light emitting unit h2 and h3 is, for example, Vf, the reverse voltage applied to the half-wave light emitting units h1 or h4 becomes Vf+Vf=2 Vf.

Similarly, the reverse voltage is applied to the half-wave light emitting units h2 and h3 for a second period at which the half-wave light emitting units h1 and h4 and the full-wave light emitting units a1 and a2 emit light by applying a positive voltage to the terminal $t_2$ and the reverse voltage applied to the half-wave light emitting unit h2 or h3 is equal to the sum (for example, 2 Vf) of the forward voltage applied to one full-wave light emitting unit a1 or a2 and the forward voltage applied to one half-wave light emitting unit h4 or h1.

In addition, when the half-wave light emitting units h1, h2, h3, and h4 are configured to include the same number of light emitting cells 100, the reverse voltage applied to these half-wave light emitting units h1, h2, h3, and h4 depends on the number of light emitting cells 200 in the full-wave light emitting units a1 and a2. Therefore, a light emitting device safe for the reverse voltage may be provided by controlling the number of light emitting cells in the full-wave light emitting units a1 and a2. For example, the number of light emitting cells in the full-wave light emitting unit may be selected in consideration of the reverse voltage of the half-wave light emitting units, preferably, in the range of 1 to 10.

As described above, according to an exemplary embodiment of the present invention, a light emitting device capable of increasing the utilization of light emitting units therein that is safe for the reverse voltage may be provided by employing the half-wave light emitting units h1, h2, h3, and h4 and the full-wave light emitting units a1 and a2 and controlling the number of light emitting cells.

Figure 3:
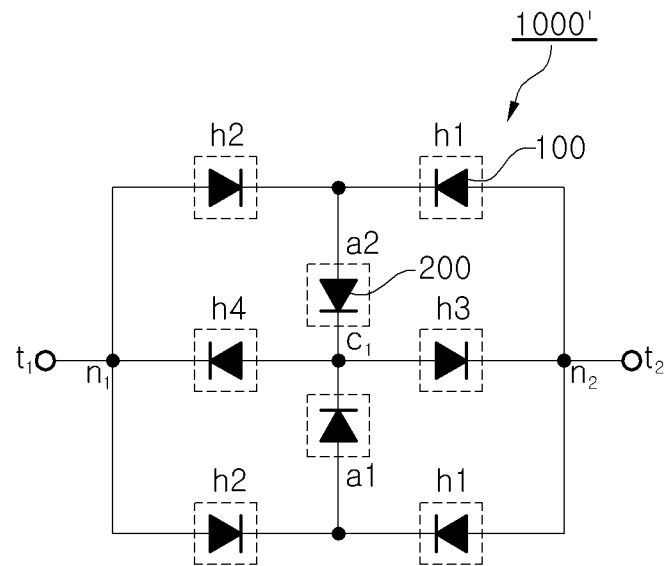
FIG. 3 is a circuit diagram of a light emitting device according to a modified first exemplary embodiment of the present invention.

According to another aspect of the present invention, the first exemplary embodiment may be implemented as shown in FIG. 3, which is modified from the light emitting diode array shown in FIG. 1.

As shown in FIG. 3, the fourth terminals of the first and second full-wave light emitting units a1 and a2 may be electrically connected to each other at the central node $c_1$ and at the same time, may be commonly connected to the first terminals of the half-wave light emitting units h3 and h4 of the second row. On the other hand, the third terminals of the first and second full-wave light emitting units a1 and a2 may be electrically connected to the second terminals of the half-wave light emitting units h1 and h2 of the first and third rows and the second terminals of the half-wave light emitting units h3 and h4 of the second row may be electrically connected to the first terminals of the other half-wave light emitting units h1 and h2 of the first and third rows, respectively, at each of the first and second nodes $n_1$ and $n_2$.

In the case of the configuration as shown in FIG. 3, the utilization of the light emitting unit becomes 62.5% as shown in FIG. 1 and the reverse voltage applied to each half-wave light emitting units h1, h2, h3, and h4 is equal to a sum of the forward voltage applied to one full-wave light emitting unit and the forward voltage applied to one half-wave light emitting unit.

Figure 4:
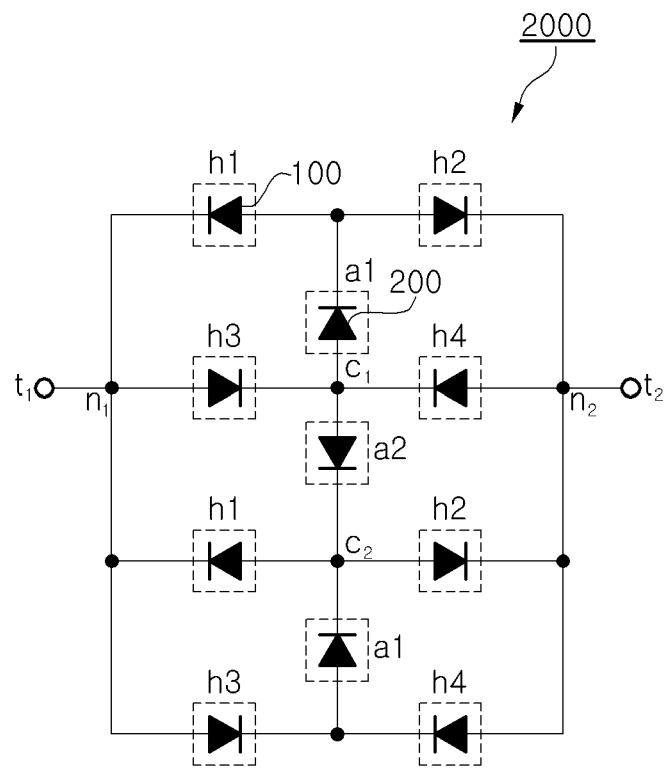
FIG. 4 is a circuit diagram of a light emitting device according to a second exemplary embodiment of the present invention.

Hereinafter, a light emitting device 2000 according to a second exemplary embodiment of the present invention will be described with reference to FIG. 4. However, for simplification of explanation, a description of the components overlapping with the first exemplary embodiment will be omitted.

Similar to the light emitting device 1000, the light emitting device 2000 according to the second exemplary embodiment of the present invention includes a plurality of half-wave light emitting units h1, h2, h3, and h4 and full-wave light emitting units a1 and a2 electrically connected by wirings on the single substrate. However, the light emitting device 2000 is different from the light emitting device 1000 including two full-wave light emitting units a1 and a2 in that it includes three full-wave light emitting units and further includes the pair of half-wave light emitting units h3 and h4 of the fourth row.

In detail, four pairs of half-wave light emitting units are disposed between the first and second nodes $n_1$ and $n_2$ and one full-wave light emitting unit a1 or a2 is connected between the pair of half-wave light emitting units h1 and h2 and the other pair of half-wave light emitting units h3 and h4, respectively. That is, the first full-wave light emitting unit a1 is connected between the pairs of half-wave light emitting units of the first and the second rows, the second full-wave light emitting unit a2 is connected between the pairs of half-wave light emitting units of the second and third rows, and the third full-wave light emitting unit a1 is connected between the pairs of half-wave light emitting units of the third and fourth rows.

In this configuration, the third terminals of the first and second full-wave light emitting units are electrically connected to each other at the central node $c_1$ and the fourth terminals of the second and third full-wave light emitting units are electrically connected to each other at the central node $c_2$. In addition, the second terminals of the half-wave light emitting units h3 and h4 of the second row are electrically connected to each other at the central node $c_1$ and the first terminals of the half-wave light emitting units h1 and h2 of the third row are electrically connected to each other at the central node $c_2$.

That is, the third terminals of the first and second full-wave light emitting units a1 and a2 are electrically connected to the second terminals of the half-wave light emitting units h3 and h4 of the second row, while the fourth terminals of the second and third full-wave light emitting units a1 and a2 are electrically connected to the first terminals of the half-wave light emitting units h1 and h2 of the third row. In addition, the fourth terminal of the first full-wave light emitting unit a1 is electrically connected to the first terminals of the half-wave light emitting units h1 and h2 of the first row and the third terminal of the third full-wave light emitting unit a1 is electrically connected to the second terminals of the half-wave light emitting units h3 and h4 of the fourth row.

In addition, the first terminals of the half-wave light emitting units h3 and h4 of the second and fourth rows are electrically connected to the second terminals of the other half-wave light emitting units h1 and h2 of the first and third rows at the first and second nodes $n_1$ and $n_2$, respectively.

Hereinafter, the operation of the light emitting device 2000 will be described with reference to FIG. 5A and FIG. 5B.

Figure 5A:
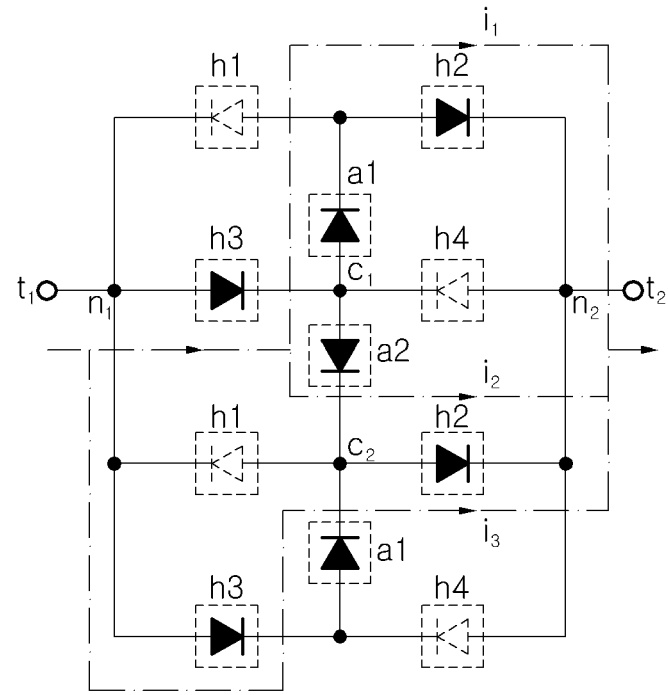
FIG. 5A and FIG. 5B are diagrams for explaining an operation of the light emitting device shown in FIG. 4.
Figure 5B:
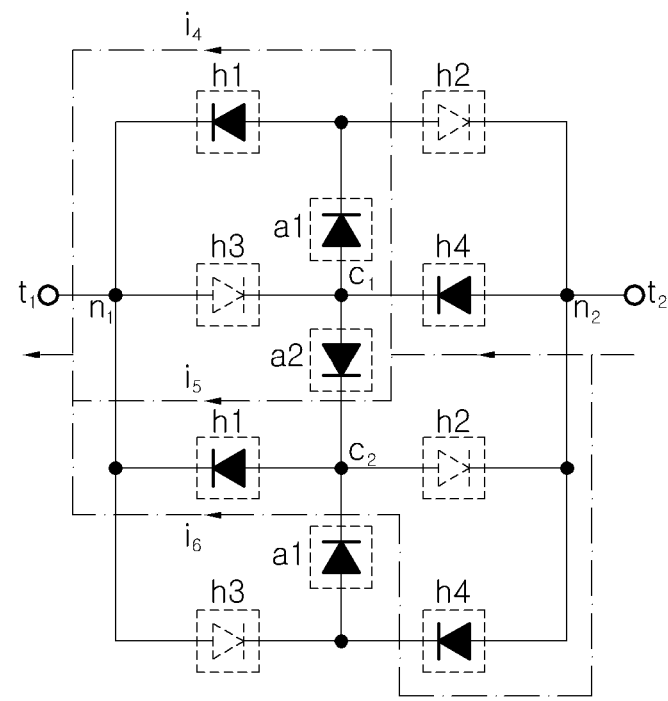

FIG. 5A and FIG. 5B show the light emitting units driven at the first and second periods of an AC voltage and the corresponding current path.

First, as shown in FIG. 5A, when a positive voltage is applied to the terminal $t_1$, light is emitted from the half-wave light emitting units h3 of the second and fourth rows, the half-wave light emitting units h2 of the first and third rows, and the first to third full-wave light emitting units a1 and a2. That is, light is emitted from seven of eleven light emitting units, such that the utilization of the light emitting units becomes 7/11=63.6%.

Next, as shown in FIG. 5B, when a positive voltage is applied to the terminal $t_2$, light is emitted from the half-wave light emitting units h4 of the second and fourth rows, the half-wave light emitting units h1 of the first and third rows, and the first to third full-wave light emitting units a1 and a2. That is, light is emitted from seven of eleven light emitting units, such that the utilization of the light emitting units becomes 7/11=63.6%.

That is, the half-wave light emitting units h2 and h3 and all the full-wave light emitting units a1 and a2 emit light while a positive voltage is applied to the terminal $t_1$ and the other half-wave light emitting units h1 and h4 and all the full-wave light emitting units a1 and a2 emit light while a positive voltage is applied to the terminal $t_2$. Therefore, the half-wave light emitting units h1 and h4 and the half-wave light emitting units h2 and h3 alternately emit light during the first and second periods according to the phase of the AC power supply and the first to third full-wave light emitting units a1 and a2 emit light during both periods regardless of the change in the phase of the AC power supply.

Therefore, according to the second exemplary embodiment of the present invention, the utilization of the light emitting unit may be further increased to 63.6%, as compared to 62.5% in the first exemplary embodiment.

Next, according to the second exemplary embodiment of the present invention, the reverse voltage applied to the half-wave light emitting units h1, h2, h3, and h4 will be described.

The forward voltage is applied to the half-wave light emitting units h2 and h3 and the full-wave light emitting units a1 and a2 and the reverse voltage is applied to the half-wave light emitting units h1 and h4, for a first period at which the half-wave light emitting units h2 and h3 and the full-wave light emitting units a1 and a2 emit light by applying a positive voltage to the terminal $t_1$ and the reverse voltage applied to the half-wave light emitting units h1 and h4 is equal to the sum of the forward voltage applied to one full-wave light emitting units a1 or a2 and the forward voltage applied to one half-wave light emitting unit h2 or h3. That is, when the forward voltage of each full-wave light emitting unit a1 and a2 and each half-wave light emitting unit h2 and h3 is, for example, Vf, the reverse voltage applied to the half-wave light emitting units h1 or h4 becomes 2 Vf.

Similarly, a reverse voltage is applied to the half-wave light emitting units h2 and h3 for a second period at which the half-wave light emitting units h1 and h4 and the full-wave light emitting units a1 and a2 emit light by applying a positive voltage to the terminal $t_2$ and a reverse voltage applied to the half-wave light emitting unit h2 and h3 is equal to a sum of a forward voltage applied to one full-wave light emitting unit a1 or a2 and a forward voltage applied to one half-wave light emitting unit h4 or h1.

As described above, according to the second exemplary embodiment of the present invention, a light emitting device capable of increasing the utilization of light emitting units therein that is safe for the reverse voltage may be provided by employing the half-wave light emitting units h1, h2, h3, and h4 and the full-wave light emitting units a1 and a2 and controlling the number of light emitting cells.

Figure 6:
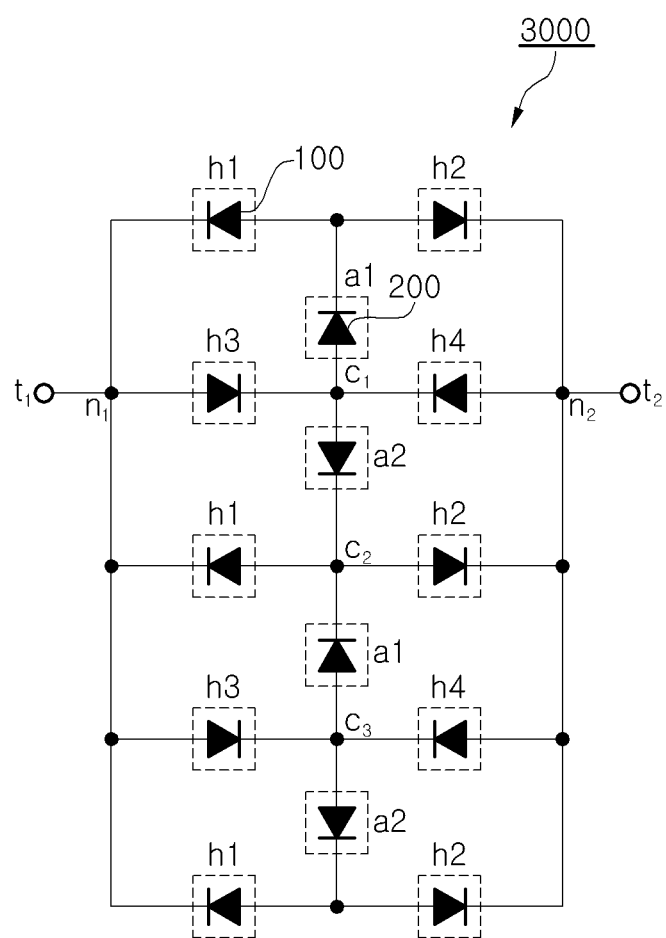
FIG. 6 is a circuit diagram of a light emitting device according to a third exemplary embodiment of the present invention.

Hereinafter, a light emitting device 3000 according to a third exemplary embodiment of the present invention will be described with reference to FIG. 6. However, for simplification of explanation, a description of the components overlapping with the above-mentioned exemplary embodiments will be omitted.

Similar to the light emitting device 2000, the light emitting device 3000 according to the third exemplary embodiment of the present invention includes the plurality of half-wave light emitting units h1, h2, h3, and h4 and the full-wave light emitting units a1 and a2 electrically connected by wirings on the single substrate. However, the light emitting device 3000 is different from the light emitting device 2000 in that it includes four full-wave light emitting units and further includes the half-wave light emitting units h1 and h2 of a fifth row.

In detail, five pairs of half-wave light emitting units are disposed between the first and second nodes $n_1$ and $n_2$ and one full-wave light emitting unit a1 or a2 is connected between the pair of half-wave light emitting units h1 and h2 and the other pair of half-wave light emitting units h3 and h4, respectively. That is, the first full-wave light emitting unit a1 is connected between the pairs of half-wave light emitting units of the first and second rows, the second full-wave light emitting unit a2 is connected between the pairs of half-wave light emitting units of the second and third rows, the third full-wave light emitting unit a1 is connected between the pairs of half-wave light emitting units of the third and fourth rows, and the fourth full-wave light emitting unit a2 is connected between the pairs of half-wave light emitting units of the fourth and fifth rows.

In this configuration, the third terminals of the first and second full-wave light emitting units are electrically connected to each other at the central node $c_1$, the fourth terminals of the second and third full-wave light emitting units are electrically connected to each other at the central node $c_2$, and the third terminals of the third and fourth full-wave light emitting units are electrically connected to each other at the central node $c_3$. In addition, the second terminals of the half-wave light emitting units h3 and h4 of the second row are electrically connected to each other at the central node $c_1$, the first terminals of the half-wave light emitting units h1 and h2 of the third row are electrically connected to each other at the central node $c_2$, and the second terminals of the half-wave light emitting units h3 and h4 of the fourth row are electrically connected to each other at the central node $c_3$.

That is, the third terminals of the first and second full-wave light emitting units a1 and a2 are electrically connected to the second terminals of the half-wave light emitting units h3 and h4 of the second row, the fourth terminals of the second and third full-wave light emitting units a1 and a2 are electrically connected to the first terminals of the half-wave light emitting units h1 and h2 of the third row, and the third terminals of the third and fourth full-wave light emitting units a1 and a2 are electrically connected to the second terminal of the half-wave light emitting units h3 and h4 of the fourth row. In addition, each of the fourth terminals of the first and fourth full-wave light emitting units a1 is electrically connected to the first terminals of the half-wave light emitting units h1 and h2 of the first and fifth rows.

In addition, the first terminals of the half-wave light emitting units h3 and h4 of the second and fourth rows are electrically connected to the second terminals of the other half-wave light emitting units h1 and h2 of the first row, the third row, and the fifth row at the first and second nodes $n_1$ and $n_2$, respectively.

In the present exemplary embodiment, when a positive voltage is applied to the terminal $t_1$, the half-wave light emitting units h3 of the second and fourth rows, the half-wave light emitting units h2 of the first, third, and fifth rows, and the first to fourth full-wave light emitting units a1 and a2 emit light and when a positive voltage is applied to the terminal $t_2$, the half-wave light emitting units h4 of the second and fourth rows, the half-wave light emitting units h1 of the first, third, and fifth rows, and the first to fourth full-wave light emitting units a1 and a2 emit light. That is, light is emitted from nine of fourteen light emitting units, such that the utilization of the light emitting units becomes 9/14=64.3%.

That is, the half-wave light emitting units h1 and h4 and the half-wave light emitting units h2 and h3 alternately emit light during the first and second periods according to the phase of the AC power supply and the first to fourth full-wave light emitting units a1 and a2 emit light during both periods regardless of the change in the phase of the AC power supply, such that the utilization of the light emitting unit according to the third exemplary embodiment of the present invention may be further increased to 64.3%, as compared to 63.6% in the second exemplary embodiment.

Meanwhile, according to the third exemplary embodiment of the present invention, the reverse voltage applied to the half-wave light emitting units h1, h2, h3, and h4 is equal to the sum of the forward voltage applied to one full-wave light emitting unit a1 or a2 and the forward voltage applied to one half-wave light emitting unit, similar to the second exemplary embodiment.

As in the foregoing first to third exemplary embodiments, the present invention may variously implement the light emitting device by additionally adding a pair of half-wave light emitting units and one full-wave light emitting diode connected thereto to a portion (row) under a circuit, on the basis of the light emitting diode array of FIG. 1. The utilization of the light emitting units of the light emitting device according to the present invention is as the following Table 1.

TABLE 1

| Used number | Driving number | Utilization (%) |
|---|---|---|
| 8 | 5 | 62.5 |
| 11 | 7 | 63.6 |
| 14 | 9 | 64.3 |
| 17 | 11 | 64.7 |
| 20 | 13 | 65.0 |
| 23 | 15 | 65.2 |

That is, as described in Table 1, the light emitting device according to the present invention increases the utilization of the light emitting units compared to the related art, thereby making it possible to provide the same amount of light even though a smaller total number of light emitting units is used.

Hereinafter, a light emitting device 4000 according to a fourth exemplary embodiment of the present invention will be described with reference to FIG. 7. However, for simplification of explanation, a description of the components overlapping with the above-mentioned exemplary embodiments will be omitted.

The light emitting device 4000 according to the fourth exemplary embodiment of the present invention is configured to include additional full-wave light emitting units a1 and a2 electrically connected between the end terminals of the adjacent two pairs of half-wave light emitting units, and additional half-wave light emitting units of which terminals having the same polarity as the end terminals of the three pairs of half-wave light emitting units are electrically connected to the end terminals of each of the three pairs of half-wave light emitting units.

Herein, both terminals of each of the full-wave light emitting units a1 or a2 are electrically connected between the pair of half-wave light emitting units h1 and h2 and the other pairs of half-wave light emitting units h3 and h4. That is, the third terminal of the full-wave light emitting unit is connected to the second terminal of the half-wave light emitting unit and the fourth terminal of the full-wave light emitting unit is electrically connected to the first terminal of the half-wave light emitting unit.

That is, the light emitting device 4000 is substantially the same as the light emitting diode array of the light emitting device 1000 except that the light emitting device 4000 further includes the third and fourth full-wave light emitting units a1 and a2 of which the fourth terminals are electrically connected to each other at the central node $c_2$, and three half-wave light emitting units (h1 and h3 of the third column) are each electrically connected to the third terminal of the third and fourth full-wave light emitting units a1 and a2 and the central node $c_2$.

Figure 7:
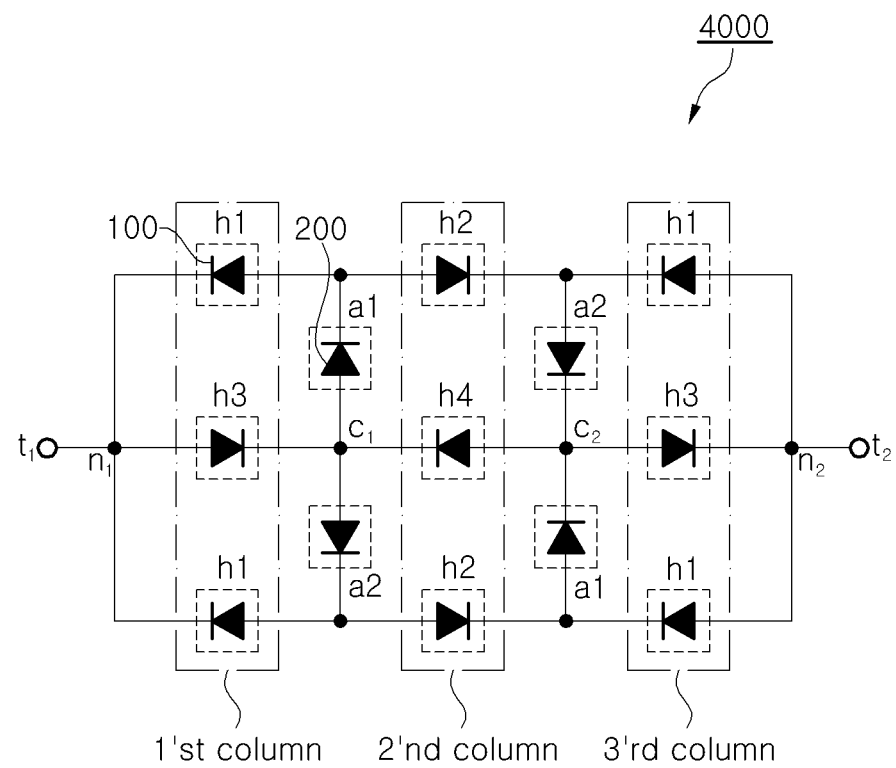
FIG. 7 is a circuit diagram of a light emitting device according to a fourth exemplary embodiment of the present invention.

In detail, referring to FIG. 7, a pair of full-wave light emitting units electrically connected at the central node $c_1$ is disposed between the half-wave light emitting units of the first and second column and a pair of full-wave light emitting units electrically connected at the central node $c_2$ is disposed between the half-wave light emitting units of the second column and the third column.

In this configuration, the third terminals of the first and second full-wave light emitting units are electrically connected to each other at the central node $c_1$ and the fourth terminals of the third and fourth full-wave light emitting units are electrically connected to each other at the central node $c_2$. In addition, the second terminals of the half-wave light emitting units h3 and h4 of the first and second columns are electrically connected to each other at the central node $c_1$ and the first terminals of the half-wave light emitting units h4 and h3 of the second and third columns are also electrically connected to each other at the central node $c_2$.

That is, the third terminals of the first and second full-wave light emitting units a1 and a2 disposed between the half-wave light emitting units of the first and second columns are connected to the second terminals of the half-wave light emitting units h3 and h4 of the first and second columns, the fourth terminals of the first and second full-wave light emitting units a1 and a2 are connected to the first terminals of the half-wave light emitting units h1 and h2 of the first and second columns, the third terminals of the third and fourth full-wave light emitting units a1 and a2 disposed between the half-wave light emitting units of the second and third columns are connected to the second terminals of the half-wave light wave light emitting units h1 and h2 of the second and third columns, and the fourth terminals of the third and fourth full-wave light emitting units a1 and a2 are connected to the first terminals of the half-wave light emitting units h3 and h4 of the second and third columns.

In addition, one half-wave light emitting unit is electrically connected between the fourth terminal of the first full-wave light emitting unit a1 and the third terminal of the third full-wave light emitting units a2 and between the fourth terminal of the second full-wave light emitting unit a2 and the third terminal of the fourth full-wave light emitting unit a2, respectively.

In addition, three half-wave light emitting units disposed in the first column are electrically connected at the first node $n_1$ and three half-wave light emitting units disposed in the third column are electrically connected at the second node $n_2$.

Hereinafter, the operation of the light emitting device 4000 will be described with reference to FIG. 8A and FIG. 8B.

Figure 8A:
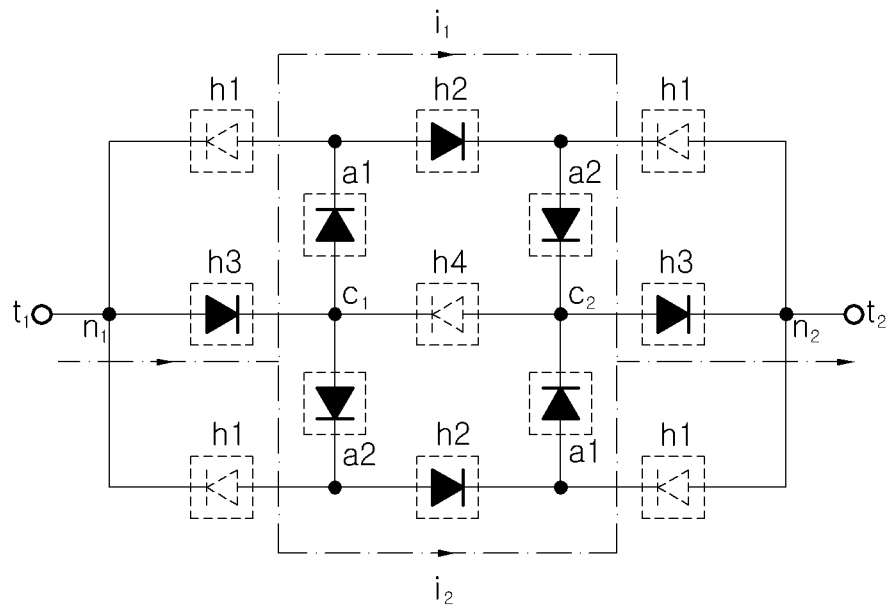
FIG. 8A and FIG. 8B are diagrams for explaining an operation of the light emitting device shown in of FIG. 7.
Figure 8B:
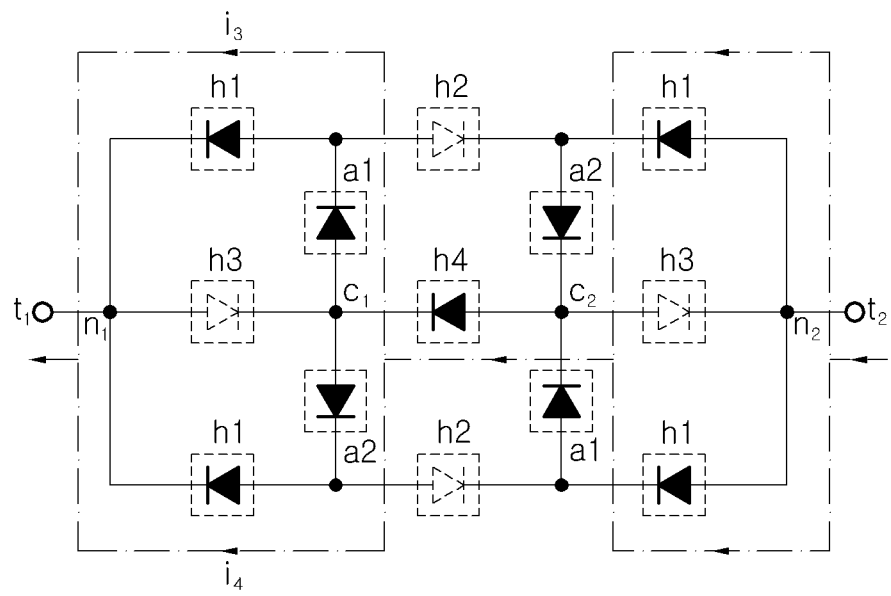

FIGS. 8A and 8B each show the light emitting units driven at the first and second periods of an AC voltage and the corresponding current path.

When a positive voltage is applied to the terminal $t_1$, current flows as shown by an arrow in FIG. 8A (see $i_1$ and $i_2$) and light is emitted from the half-wave light emitting units h3 disposed in the first and third columns, the half-wave light emitting units h2 disposed in the second column, and the first to fourth full-wave light emitting units a1 and a2. That is, light is emitted from eight of thirteen light emitting units, such that the utilization of the light emitting units becomes 8/13=61.5%.

On the other hand, when a positive voltage is applied to the terminal $t_2$, current flows as shown by an arrow in FIG. 8B (see $i_3$ and $i_4$) and light is emitted from the half-wave light emitting units h1 disposed in the first and third columns, the half-wave light emitting units h4 disposed in the second column, and the first to fourth full-wave light emitting units a1 and a2. That is, light is emitted from nine of thirteen light emitting units, such that the utilization of the light emitting units becomes 9/13=69.2%.

That is, the half-wave light emitting units h1 and h4 and the half-wave light emitting units h2 and h3 alternately emit light during the first and second periods according to the phase of the AC power supply and the first to fourth full-wave light emitting units a1 and a2 emit light during both periods regardless of the change in the phase of the AC power supply.

Therefore, in the case of the fourth exemplary embodiment of the present invention, the number of half-wave light emitting units h1, h2, h3, and h4 driven at the first and second periods of the AC voltage are different from each other, such that there is a difference in the utilization of the light emitting unit according to the period of the AC voltage. Therefore, when compared with the light emitting device 1000 of the first exemplary embodiment, the utilization of the light emitting units in the light emitting device 4000 may be lower during the first period and the utilization of the light emitting unit may be higher during the second period. However, when considering an average for the first and second periods, the utilization of the light emitting unit of the light emitting device 4000 is (61.5+69.2)/2=65.35%, which is higher than 62.5% that is the utilization of the light emitting unit of the light emitting device 1000.

Meanwhile, the maximum reverse voltage applied to one half-wave light emitting unit h1, h2, h3, or h4 in the light emitting device 4000, which is the reverse voltage applied to the half-wave light emitting unit h2 or h4 disposed in the second column, is equal to the sum of the forward voltage applied two full-wave light emitting units a1 and a2 and the forward voltage applied to one half-wave light emitting unit h2 or h4. That is, for example, when the forward voltage of each full-wave light emitting unit a1 and a2 and each half-wave light emitting unit h2 and h4 is Vf, the magnitude in the maximum reverse voltage applied to one light emitting unit in the light emitting device 4000 becomes 2 Vf+Vf=3 Vf.

Therefore, according to the fourth exemplary embodiment of the present invention, the maximum reverse voltage applied to one half-wave light emitting unit may be slightly higher than that of the first exemplary embodiment. However, a light emitting device capable of reducing the risk of damage to the light emitting diode and increasing the utilization of light emitting units therein by controlling the number of light emitting cells in the half-wave light emitting units h1, h2, h3, and h4 and the full-wave light emitting units a1 and a2 may be provided.

Figure 9:
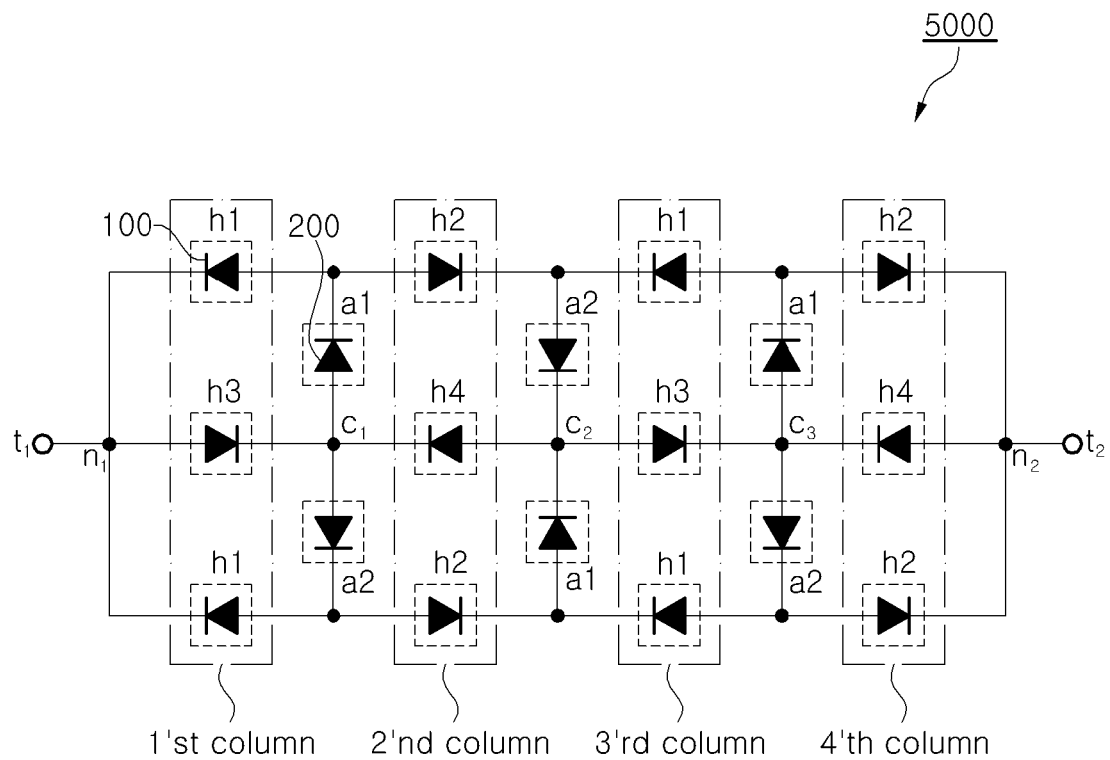
FIG. 9 is a circuit diagram of a light emitting device according to a fifth exemplary embodiment of the present invention.

Hereinafter, a light emitting device 5000 according to a fifth exemplary embodiment of the present invention will be described with reference to FIG. 9. However, for simplification of explanation, a description of the components overlapping with the above-mentioned exemplary embodiment will be omitted.

In FIG. 1, the light emitting device 5000 according to the fifth exemplary embodiment of the present invention is configured to further include additional pairs of half-wave light emitting units of which the terminals having the same polarity as one end the terminals of the three pairs of half-wave light emitting units are electrically connected to the end terminals of each of the three pairs of half-wave light emitting units, the additional full-wave light emitting units a1 and a2 electrically connected between end terminals of the adjacent two pairs of half-wave light emitting units, and the additional full-wave light emitting units electrically connected to the adjacent two pairs of pairs of half-wave light emitting units connected to the end terminals of the half-wave light emitting units.

Herein, both terminals of each of the full-wave light emitting units a1 or a2 are electrically connected between the pair of half-wave light emitting units h1 and h2 and the other pairs of half-wave light emitting units h3 and h4. That is, the third terminal of the full-wave light emitting unit is connected to the second terminal of the half-wave light emitting unit and the fourth terminal of the full-wave light emitting unit is electrically connected to the first terminal of the half-wave light emitting unit.

As a result, the light emitting device 5000 is substantially the same as the light emitting diode array of the light emitting device 4000 except that the light emitting device 5000 includes the half-wave light emitting units of the first to fourth columns and the three pairs of full-wave light emitting units. That is, the light emitting device 5000 further includes the fifth and sixth full-wave light emitting units a1 and a2 of which the third terminals are electrically connected to each other at the central node $c_3$ and three half-wave light emitting units (h2 and h4 of the fourth column) each electrically connected to the fourth terminals of the fifth and sixth full-wave light emitting units a1 and a2 and the central node $c_3$.

In detail, a pair of full-wave light emitting units electrically connected to each other at the central node $c_1$ is disposed between the half-wave light emitting units of the first and second columns, a pair of full-wave light emitting units electrically connected to each other at the central node $c_2$ is disposed between the half-wave light emitting units of the second and third columns, and a pair of full-wave light emitting units electrically connected to each other at the central node $c_3$ is disposed between the half-wave light emitting units of the third and fourth columns.

In addition, the third terminals of the first and second full-wave light emitting units are electrically connected to each other at the central node $c_1$, the fourth terminals of the third and fourth full-wave light emitting units are electrically connected to each other at the central node $c_2$, and the third terminals of the fifth and sixth full-wave light emitting units are electrically connected to each other at the central node $c_3$. In addition, the second terminals of the half-wave light emitting units h3 and h4 of the first and second columns are electrically connected to each other at the central node $c_1$, the first terminals of the half-wave light emitting units h4 and h3 of the second and third columns are electrically connected to each other at the central node $c_2$, and the second terminals of the half-wave light emitting units h3 and h4 of the third and fourth columns are electrically connected to each other at the central node $c_3$.

That is, the third terminals of the first and second full-wave light emitting units a1 and a2 disposed between the half-wave light emitting units of the first and second columns are connected to the second terminals of the half-wave light emitting units h3 and h4 of the first and second columns, the fourth terminals of the first and second full-wave light emitting units a1 and a2 are connected to the first terminals of the half-wave light emitting units h1 and h2 of the first and second columns, the third terminals of the third and fourth full-wave light emitting units a1 and a2 disposed between the half-wave light emitting units of the second and third columns are connected to the second terminals of the half-wave light wave light emitting units h1 and h2 of the second and third columns, the fourth terminals of the third and fourth full-wave light emitting units a1 and a2 are connected to the first terminals of the half-wave light emitting units h3 and h4 of the second and third columns, the third terminals of the fifth and sixth full-wave light emitting units a1 and a2 disposed between the half-wave light emitting units of the third and fourth columns are connected to the second terminal of the half-wave light emitting units h3 and h4 of the third and fourth columns, and the fourth terminal of the fifth and sixth full-wave light emitting units a1 and a2 are connected to the first terminal of the half-wave light emitting units h1 and h2 of the third and fourth columns.

In addition, one half-wave light emitting unit is connected between the third terminal of the third full-wave light emitting unit a2 and the fourth terminal of the fifth full-wave light emitting units a1 and between the third terminal of the fourth full-wave light emitting unit a1 and the fourth terminal of the sixth full-wave light emitting unit a2, respectively.

In addition, three half-wave light emitting units disposed in the first column are electrically connected at the first node $n_1$ and three half-wave light emitting units disposed in the fourth column are electrically connected at the second node $n_2$.

Meanwhile, when a positive voltage is applied to the terminal $t_1$ for connecting to the external power supply, light is emitted from the half-wave light emitting units h3 disposed in the first and third columns, the half-wave light emitting units h2 disposed in the second and fourth columns, and the first to sixth full-wave light emitting units a1 and a2. That is, light is emitted from twelve of eighteen light emitting units, such that the utilization of the light emitting units becomes 12/18=66.7%.

Meanwhile, when a positive voltage is applied to the terminal $t_2$, light is emitted from the half-wave light emitting units h4 disposed in the second and fourth columns, the half-wave light emitting units h1 disposed in the first and third columns, and the first to sixth full-wave light emitting units a1 and a2. That is, light is emitted from twelve of eighteen light emitting units, such that the utilization of the light emitting units becomes 12/18=66.7%.

That is, the half-wave light emitting units h1 and h4 and the other half-wave light emitting units h2 and h3 alternately emit light at the first and second periods according to the phase of the AC power supply and the first to sixth full-wave light emitting units a1 and a2 emit light at all the periods regardless of the change in the phase of the AC power supply, such that the utilization of the light emitting unit according to the fifth exemplary embodiment of the present invention may be increased to 66.7% at both of the first and second periods of AC voltage, unlike the fourth exemplary embodiment.

Meanwhile, the magnitude in the maximum reverse voltage applied to one half-wave light emitting unit in the light emitting device 5000, which is the reverse voltage applied to the half-wave light emitting unit disposed in each of the second and third columns, becomes 3 Vf, when the forward voltage of each full-wave light emitting unit a1 and a2 and each half-wave light emitting unit h1, h2, h3, and h4 is Vf.

Therefore, according to the fifth exemplary embodiment of the present invention, a light emitting device capable of increasing the utilization of light emitting units therein that is safe for the reverse voltage may be provided by controlling the number of light emitting cells in the half-wave light emitting units h1, h2, h3, and h4 and the full-wave light emitting units a1 and a2.

Figure 13:
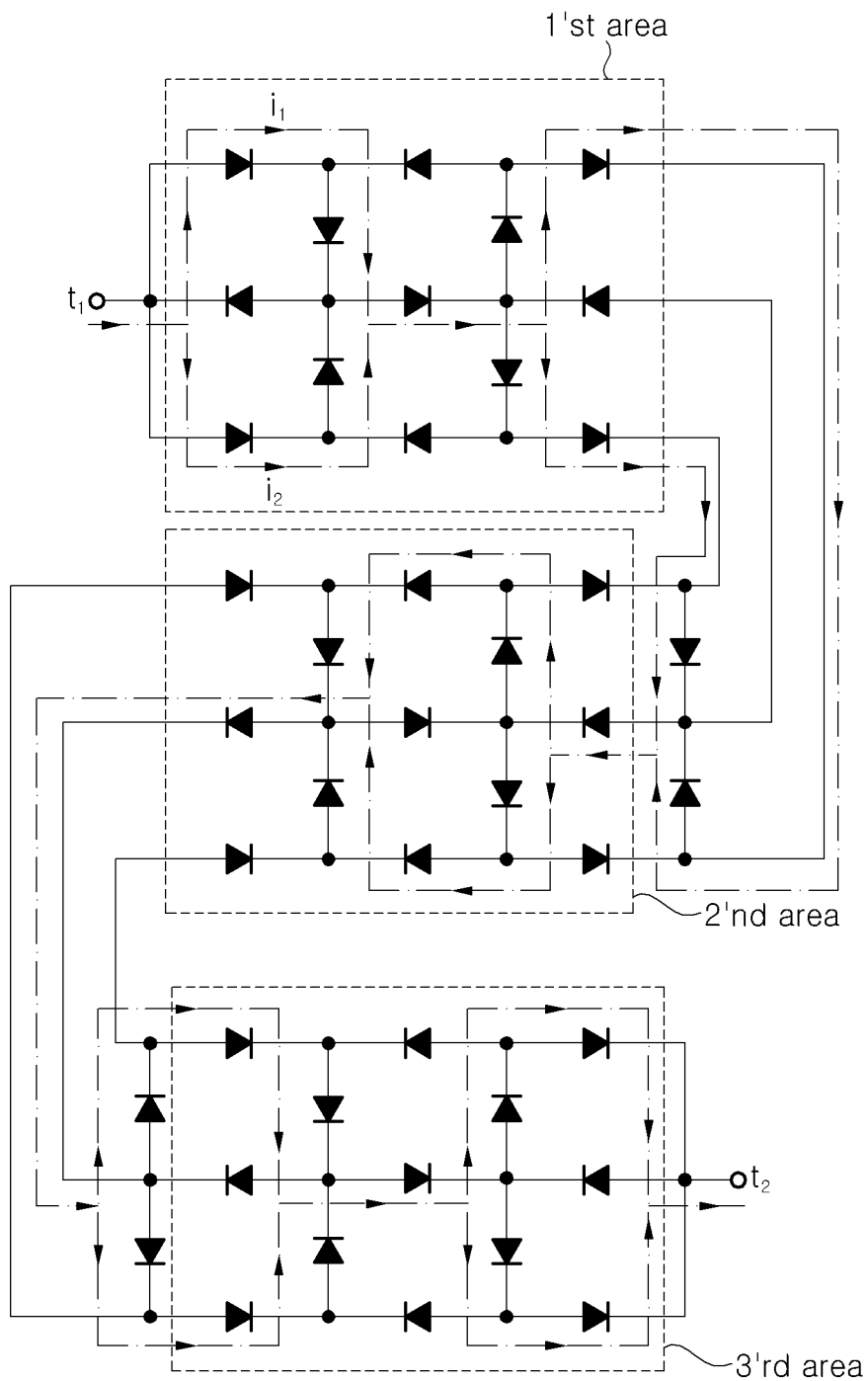
FIG. 13 is a circuit diagram of a light emitting device according to an exemplary embodiment of the present invention.

In addition, as shown in FIG. 13, the utilization of the light emitting unit may be further increased by further increasing the number of half-wave light emitting units and the number of full-wave light emitting units.

That is, as in the foregoing fourth to fifth exemplary embodiments, those skilled in the art may variously implement the light emitting device according to the present invention by additionally adding a pair of full-wave light emitting units and the plurality of half-wave light emitting diodes connected thereto to a right portion (column) under a circuit, on the basis of the light emitting diode array of FIG. 1.

Figure 10:
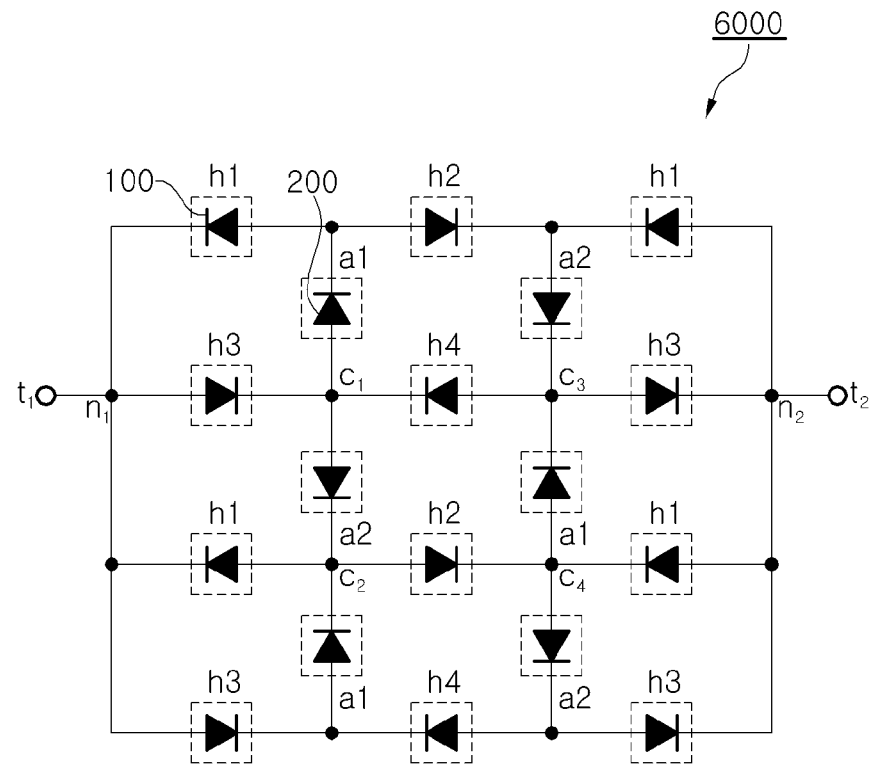
FIG. 10 is a circuit diagram of a light emitting device according to a sixth exemplary embodiment of the present invention.

Hereinafter, a light emitting device 6000 according to a sixth exemplary embodiment of the present invention will be described with reference to FIG. 10. However, for simplification of explanation, a description of the components overlapping with the above-mentioned exemplary embodiment will be omitted.

Similar to the light emitting device 2000 or the light emitting device 4000, the light emitting device 6000 according to the present invention includes the plurality of half-wave light emitting units h1, h2, h3, and h4 and the full-wave light emitting units a1 and a2 electrically connected by wirings on the single substrate. However, unlike the case in which the light emitting device 2000 includes the half-wave light emitting units of the first and second columns and three full-wave light emitting units disposed therebetween, the light emitting device 6000 includes the half-wave light emitting units of the first, second, and third columns and a total of six full-wave light emitting units each disposed therebetween. Meanwhile, the light emitting device 6000 may be configured as a structure further including three half-wave light emitting units to a portion (fourth rows) under the light emitting diode array of the light emitting device 4000.

In detail, the three full-wave light emitting units of which the same terminals are electrically connected to each other at the central nodes $c_1$ and $c_2$ are disposed between the half-wave light emitting units of the first and second columns and the three full-wave light emitting units of which the same terminals are electrically connected to each other at the central nodes $c_3$ and $c_4$ are disposed between the half-wave light emitting units of the second and third columns.

Herein, both terminals of each of the full-wave light emitting units a1 or a2 are electrically connected between the pair of half-wave light emitting units h1 and h2 and the other pairs of half-wave light emitting units h3 and h4.

In addition, the third terminals of the first and second full-wave light emitting units are electrically connected to each other at the central node $c_1$, the fourth terminals of the second and third full-wave light emitting units are electrically connected to each other at the central node $c_2$, the fourth terminals of the fourth and fifth full-wave light emitting units are electrically connected to each other at the central node $c_3$, and the third terminals of the fifth and sixth full-wave light emitting units are electrically connected to each other at the central node $c_4$.

In addition, the second terminals of the half-wave light emitting units (h3 and h4 of second row) of the first and second columns are also electrically connected to each other at the central node $c_1$, the first terminals of the half-wave light emitting units (h1 and h2 of third row) of the first and second columns are also electrically connected to each other at the central node $c_2$, the first terminal of the half-wave light emitting units (h4 and h3 of second row) of the second and third columns are also electrically connected to each other at the central node $c_3$, and the second terminals of the half-wave light emitting units (h2 and h1 of third row) of the second and third columns are also electrically connected to each other at the central node $c_4$.

That is, the third terminals of the first and second full-wave light emitting units are electrically connected to the second terminal of the half-wave light emitting units (h3 and h4 of second row) of the first and second columns, the fourth terminals of the second and third full-wave light emitting units are electrically connected to the first terminal of the half-wave light emitting units (h1 and h2 of third row) of the first and second rows, the fourth terminals of the fourth and fifth full-wave light emitting units are electrically connected to the first terminal of the half-wave light emitting units (h4 and h3 of second row) of the second and third columns, and the third terminals of the fifth and sixth full-wave light emitting units are electrically connected to the second terminals of the half-wave light emitting units (h2 and h1 of third row) of the second and third columns.

In addition, four half-wave light emitting units disposed in the first column are electrically connected at the first node $n_1$ and four half-wave light emitting units disposed in the third column are electrically connected at the second node $n_2$.

Meanwhile, when a positive voltage is applied to the terminal $t_1$ for connecting to the external power supply, light is emitted from the half-wave light emitting units h3 disposed in the first and third columns, the half-wave light emitting units h2 disposed in the second column, and the first to sixth full-wave light emitting units a1 and a2.

On the other hand, when a positive voltage is applied to the terminal $t_2$, light is emitted from the half-wave light emitting units h1 disposed in the first and third columns, the half-wave light emitting units h4 disposed in the second column, and the first to sixth full-wave light emitting units a1 and a2.

That is, the half-wave light emitting units h1 and h4 and the other half-wave light emitting units h2 and h3 alternately emit light during the first and second periods according to the phase of the AC power supply, the first to sixth full-wave light emitting units a1 and a2 emit light during both periods regardless of the change in the phase of the AC power supply, and according to the sixth exemplary embodiment of the present invention, light is emitted from 13 light emitting units of a total of 18 light emitting units, such that the utilization of the light emitting unit becomes 13/18=72.2% and the utilization of the light emitting units may be further increased to be greater than that of the second exemplary embodiment.

Meanwhile, the magnitude of the maximum reverse voltage applied to one half-wave light emitting unit in the light emitting device 6000, which is the reverse voltage applied to the half-wave light emitting unit h2 or h4 disposed in the second column, becomes 3 Vf, when the forward voltage of each full-wave light emitting unit a1 and a2 and each half-wave light emitting unit h1, h2, h3, and h4 is Vf.

Therefore, according to the sixth exemplary embodiment of the present invention, a light emitting device capable of increasing the utilization of light emitting units therein that is safe for the reverse voltage may be provided by controlling the number of light emitting cells in the half-wave light emitting units h1, h2, h3, and h4 and the full-wave light emitting units a1 and a2.

According to another aspect of the present invention, the light emitting device may be configured by including the plurality of light emitting diode arrays having at least one of the structures from the above-mentioned exemplary embodiments and electrically connecting the plurality of structures. An example of the light emitting device is shown in FIG. 11 and FIG. 12.

Figure 11:
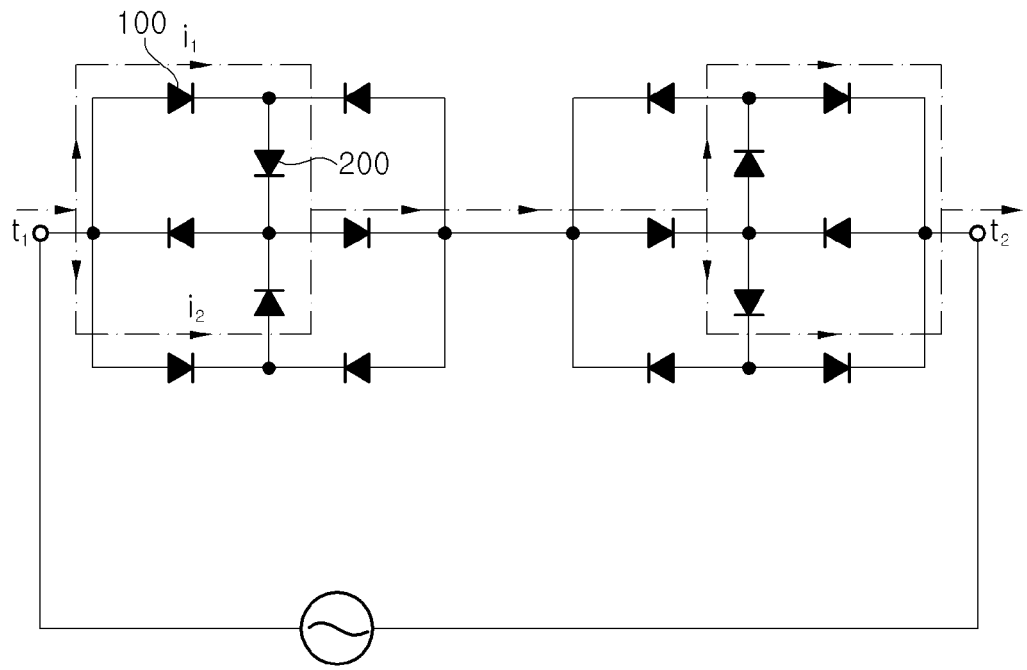
FIG. 11 is a circuit diagram of a light emitting device according to an exemplary embodiment of the present invention.
Figure 12:
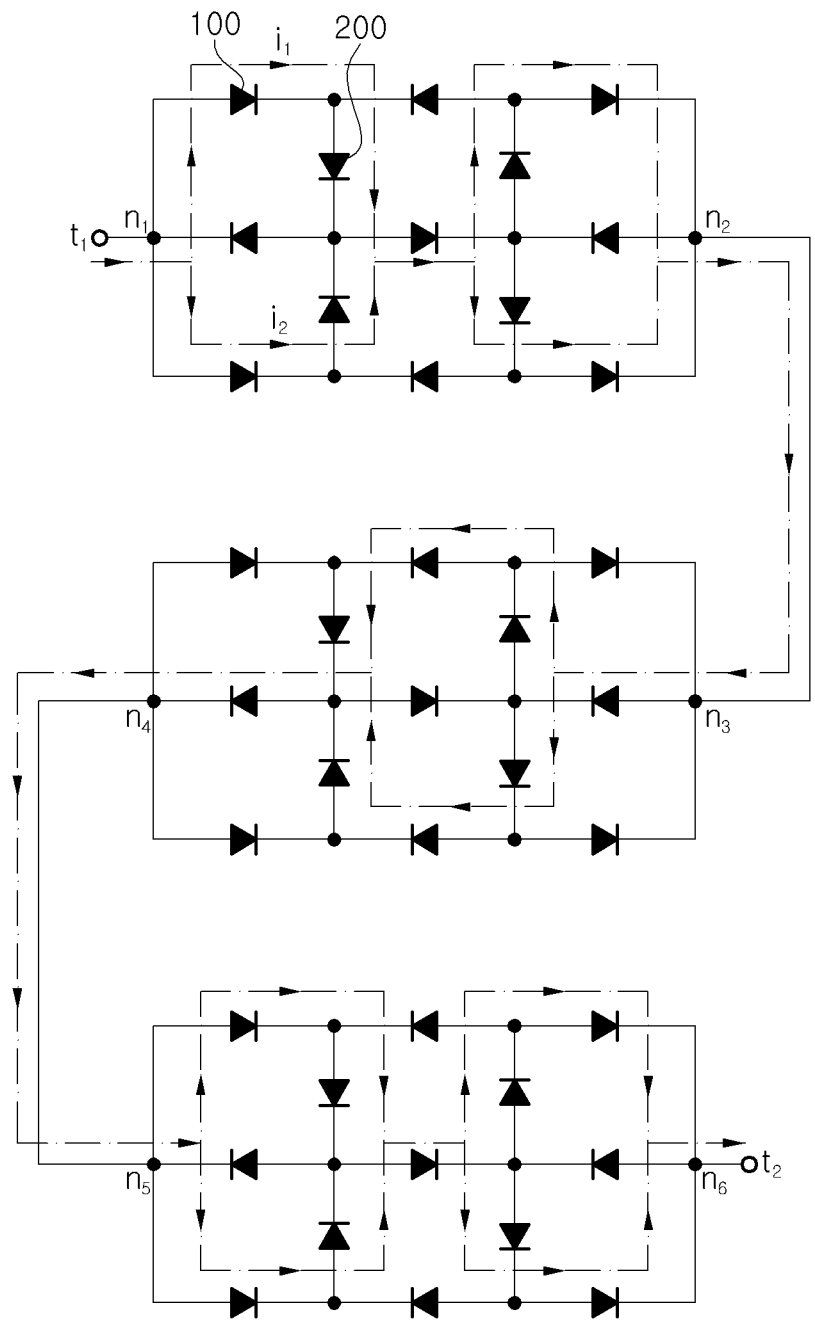
FIG. 12 is a circuit diagram of a light emitting device according to an exemplary embodiment of the present invention.

FIG. 11 shows a structure where the light emitting diode arrays of FIG. 1 and FIG. 3 are connected in series. However, for simplification of illustration, only the light emitting cells 100 and 200 are shown, instead of each half-wave light emitting unit and each full-wave light emitting unit.

In addition, the current paths $i_1$ and $i_2$ corresponding to when a positive voltage is applied to the terminal $t_1$ are shown by an arrow.

According to the configuration shown in FIG. 11, the utilization of the light emitting unit becomes 62.5%, as in the light emitting diode array of FIG. 1 and FIG. 3.

Similarly, FIG. 12 is a diagram configuring the light emitting device by connecting the plurality of light emitting diode arrays according to the fourth exemplary embodiment shown in FIG. 7 in series.

According to the configuration shown in FIG. 12, the utilization of the light emitting unit is similar to the case where the light emitting diode array of FIG. 7 is configured by itself. In detail, the utilization of the light emitting units when a positive voltage is applied to the terminal $t_1$ becomes 26/39=66.7% and the utilization of the light emitting unit when a positive voltage is applied to the terminal $t_2$ becomes 25/39=64.1%.

That is, when configuring the light emitting device as shown in FIG. 12, the number of half-wave light emitting units 100 driven at the first and second periods of AC voltage are different from each other, such that the light emitting device causes the difference in the utilization of the light emitting unit.

Meanwhile, when the circuit configuration shown in FIG. 12 is implemented as the plurality of light emitting units (or light emitting cells) on the substrate having a predetermined area, the plurality of light emitting units (or light emitting cells) may be disposed through the connection between the node $n_2$ and the node $n_3$ and the connection between the node $n_4$ and the node $n_5$.

For example, as shown in FIG. 12, 39 light emitting cells are divided into three areas (upper area, intermediate area, lower area) on the substrate. When intending to increase the number of light emitting cells according to the magnitude in applied voltage, this may be advantageous in increasing the utilization of the light emitting area on the substrate.

Hereinafter, another exemplary embodiment of the light emitting device according to the present invention will be described with reference to FIG. 13. Meanwhile, for simplification, FIG. 13 shows one light emitting cell, instead of each full-wave light emitting unit and each half-wave light emitting unit.

As in the fourth and fifth exemplary embodiments, the light emitting unit according to the present invention continuously adds the additional half-wave light emitting units (or pairs) and the full-wave light emitting units to the basic structure shown in FIG. 1, thereby making it possible to increase the ratio of the number of driven light emitting units to the number of entire light emitting units.

In addition, when implementing the circuit configuration as the plurality of light emitting units (or light emitting cells) on the actual substrate, the utilization of the light emitting area on the entire substrate may be further increased according to the wiring connection scheme.

Referring to FIG. 13, the light emitting device according to another exemplary embodiment of the present invention includes the half-wave light emitting units of the first to ninth columns and the full-wave light emitting units disposed between the columns (for example, between the first and second columns, between the second and third columns, etc.) of the adjacent two half-wave light emitting units.

In this case, when intending to implement the light emitting device of FIG. 13 on the actual substrate, as shown in FIG. 13, the half-wave light emitting units of the first to third columns and the full-wave light emitting units therebetween may be grouped to belong to the first area, the half-wave light emitting units of the fourth to sixth columns and the full-wave light emitting units therebetween may be grouped to belong to the second area, and the half-wave light emitting units of the seventh to ninth columns and the full-wave light emitting units therebetween may be grouped to belong to the third area. The second area may be disposed under the first area and the third area may be disposed under the second area.

In addition, after disposing the light emitting units on the substrate, in forming the wirings between the first area and the second area and between the second area and the third area, it may be formed to connect the half-wave light emitting unit disposed at the right upper end of the first area to the half-wave light emitting unit disposed at the right lower end of the second area, the half-wave light emitting unit disposed at the right middle of the first area to the half-wave light emitting unit disposed at the right middle of the second area, and the half-wave light emitting unit disposed at the right lower end of the first area to the half-wave light emitting unit disposed at the right upper end of the second area.

Similarly, the wirings may be formed to connect the half-wave light emitting unit disposed at the left upper end of the second area to the half-wave light emitting unit disposed at the left lower end of the third area, the half-wave light emitting unit disposed at the left middle of the second area to the half-wave light emitting unit disposed at the left middle of the third area, and the half-wave light emitting unit disposed at the left lower end of the second area to the half-wave light emitting unit disposed at the left upper end of the third area. In addition, one full-wave light emitting unit may be disposed between two of the three wirings extending between the first area and the second area, and be connected to the two wirings, respectively. Similarly, one full-wave light emitting unit may be disposed between two of the three wirings extending between the second area and the third area, and be connected to the two wirings, respectively.

When the light emitting units are disposed on the substrate by being divided into the groups of the first to third areas and the wiring connections between respective areas are formed as shown in FIG. 13, many light emitting units having higher integration may be formed on the substrate, thereby making it possible to further increase the utilization of the light emitting area on the entire substrate at the time of driving the light emitting device.

In addition, in FIG. 13, all the light emitting units may be grouped so that they are disposed in the first to third areas. However, as the number of added half-wave and full-wave light emitting areas is increased, it is possible to increase the number of areas, such as a fourth area, a fifth area, a sixth area, or the like, so that the light emitting areas may be disposed in these areas. In this case, however, the wiring connection scheme may have the same general structure as in the foregoing description.

In addition, FIG. 13 shows that the light emitting units disposed in each area is the same as the structure shown in FIG. 7. However, according to the exemplary embodiment, the light emitting units disposed in each area may be the same as the structure shown in FIG. 10. In this case, however, the wiring formed between respective areas is four.

Figure 14:
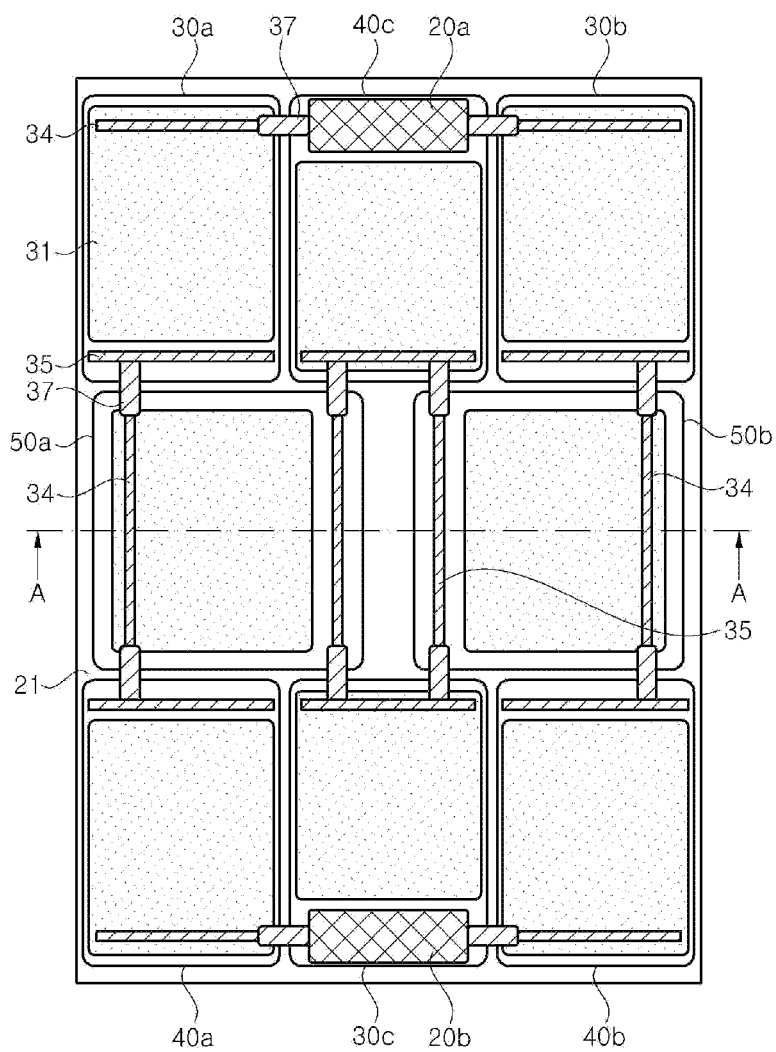
FIG. 14 is a schematic plan view showing a light emitting device according to an exemplary embodiment of the present invention.
Figure 15:
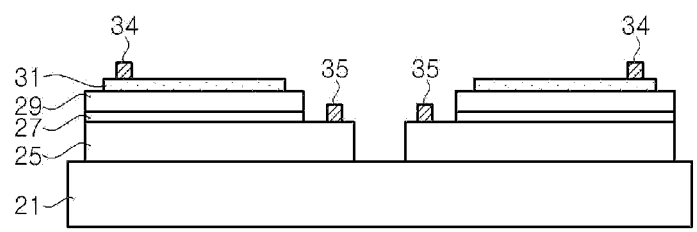
FIG. 15 is a cross-sectional view taken along line A-A of the light emitting device shown in FIG. 14.
Figure 16:
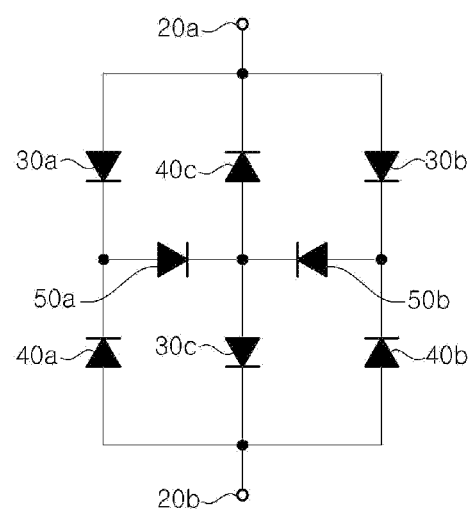
FIG. 16 is an equivalent circuit diagram of the light emitting device shown in FIG. 14.

FIG. 14 is a plan view showing the light emitting device according to another exemplary embodiment of the present invention, FIG. 15 is a cross-sectional view taken along line A-A of FIG. 14, and FIG. 16 is an equivalent circuit diagram of FIG. 14.

Referring to FIG. 14, the light emitting device includes a substrate 21, first and second electrode pads 20a and 20b, first branch half-wave light emitting cells 30a and 30b, a first merge half-wave light emitting cell 30c, second branch half-wave light emitting cells 40a and 40b, a second merge half-wave light emitting cell 40c, full-wave light emitting cells 50a and 50b, and wirings 37. In addition, a transparent electrode layer 31, a p-electrode 34, and an n-electrode 35 may be disposed on each light emitting cell. In addition, the light emitting device may include an insulating layer (not shown) or a protective layer.

The substrate 21 may be an insulating substrate such as sapphire, but is not limited thereto and therefore, may be a conductive substrate having the insulating layer formed thereon. In addition, the substrate 21 may be a growth substrate for growing compound semiconductor layers, but is not limited thereto and therefore, may be a supporting substrate attached on the compound semiconductor layer grown on the growth substrate. The substrate 21 may be a substantially quadrangular shape and as shown, may be a rectangular shape.

The half-wave light emitting cells 30a, 30b, 30c, 40a, 40b, and 40c and the full-wave light emitting cells 50a and 50b are arranged on the substrate 21 and as shown in FIG. 15, each of them includes a first conductivity-type lower semiconductor layer 25, an active layer 27, and a second conductivity-type upper semiconductor layer 29. The active layer 27 may have a single quantum well structure or a multi-quantum well structure and the materials and compositions thereof are selected according to the desired light emitting wavelength. For example, the active layer may be made of an AlInGaN-based compound semiconductor, for example, InGaN. Meanwhile, the lower and upper semiconductor layers 25 and 29 may be made of a material having a larger bandgap than the active layer 27 and may be made of an AlInGaN-based compound semiconductor, for example, GaN.

Meanwhile, buffer layers (not shown) may be interposed between the lower semiconductor layer 25 and the substrate 21. The buffer layers may be spaced apart from each other, but are not limited thereto. When the buffer layers are made of a material having a large insulating property or resistance, they may be connected to each other.

As shown, the upper semiconductor layer 29 is disposed over some area of the lower semiconductor layer 25 and the active layer 27 is interposed between the upper semiconductor layer 29 and the lower semiconductor layer 25. Further, the transparent electrode layer 31 may be disposed on the upper semiconductor layer 29. The transparent electrode layer 31 may be made of materials such as indium tin oxide (ITO), Ni/Au, etc.

The lower semiconductor layer 25 and the upper semiconductor layer 29 may each be an n-type semiconductor layer and a p-type semiconductor, and vice versa. The present exemplary embodiment describes that the lower semiconductor layer 25 becomes an n-type semiconductor layer and the upper semiconductor layer 29 becomes a p-type semiconductor layer. Therefore, an n-electrode 35 is disposed on the lower semiconductor layer 25 and a p-electrode 34 is disposed on the upper semiconductor layer 29 or the transparent electrode layer 31.

The first and second electrode pads 20a and 20b, which are pads for supplying power from the external power supply, for example, the AC power supply, may be, for example, pads to which the bonding wire may be bonded. The light emitting device is driven by power applied to the first and second electrode pads 20a and 20b. The first and second electrode pads 20a and 20b may be disposed near edges of opposite sides of the substrate 21. The first and second electrode pads 20a and 20b may be directly formed on the substrate 21 but is not limited thereto. As shown, they may be formed on the merge half-wave light emitting cells 40c and 30c, respectively. For example, the first electrode pad 20a may be disposed on the lower semiconductor layer 25 of the second merge half-wave light emitting cell 40c disposed at an edge of a first side of the substrate 21 and the second electrode pad 20b may be disposed on the lower semiconductor layer 25 of the first merge half-wave light emitting cell 30c disposed at an edge of a second side of the substrate 21 opposite to the first side. In this case, the first electrode pad 20a and the second electrode pad 20b may each be disposed on the n-electrode of the merge half-wave light emitting cells 40c and 30c, respectively and serve as the n-electrode.

The first branch half-wave light emitting cells 30a and 30b are electrically connected to the first electrode pad 20a, respectively. That is, the first branch half-wave light emitting cell 30a is connected to the first electrode pad 20a through the wiring 37 and the first branch half-wave light emitting cell 30b is connected to the first electrode pad 20a through another wiring 37. For example, the p-electrodes 34 of the first branch half-wave light emitting cells 30a and 30b may each be connected to the first electrode pad 20a through the wirings 37.

Meanwhile, a full-wave light emitting cell 50a is connected to the first branch half-wave light emitting cell 30a and a full-wave light emitting cell 50b is connected to the first branch half-wave light emitting cell 30b. As shown, the first branch half-wave light emitting cells 30a and 30b are each connected to the p-electrode 34 of the full-wave light emitting cells 50a and 50b.

In addition, the full-wave light emitting cells 50a and 50b are again connected to the first merge half-wave light emitting cell 30c. That is, each n-electrode 35 of the full-wave light emitting cells 50a and 50b is connected to the p-electrode 34 of the first merge half-wave light emitting cell 30c through the wiring 37.

Meanwhile, the second branch half-wave light emitting cells 40a and 40b are electrically connected to the second electrode pad 20b, respectively. That is, the second branch half-wave light emitting cell 40a is connected to the second electrode pad 20b through the wiring 37 and the second branch half-wave light emitting cell 40b is connected to the second electrode pad 20b through another wiring 37. For example, the p-electrodes 34 of the second branch half-wave light emitting cells 40a and 30b may each be connected to the second electrode pad 20b through the wirings 37.

Further, the full-wave light emitting cell 50a is connected to the second branch half-wave light emitting cell 40a and the full-wave light emitting cell 50b is connected to the second branch half-wave light emitting cell 40b. As shown, the second branch half-wave light emitting cells 40a and 40b are each connected to the p-electrode 34 of the full-wave light emitting cells 50a and 50b.

In addition, the full-wave light emitting cells 50a and 50b are again connected to the second merge half-wave light emitting cell 40c. That is, each n-electrode 35 of the full-wave light emitting cells 50a and 50b is connected to the p-electrode 34 of the second merge half-wave light emitting cell 40c through the wiring 37.

In the present exemplary embodiment, the first branch half-wave light emitting cells 30a and 30b may each be disposed in parallel on either side of the second merge half-wave light emitting cell 40c disposed at an edge of one side of the substrate 21, and the second branch half-wave light emitting cells 40a and 40b may each be disposed in parallel on either side of the first merge half-wave light emitting cell 30c disposed at an edge of the other side of the substrate 21. In addition, the full-wave light emitting cells 50a and 50b may be disposed in parallel between the half-wave light emitting cells 30a, 40c, and 30b disposed in parallel along an edge of one side of the substrate 21 and the half-wave light emitting cells 40a, 30c, and 40b may be disposed in parallel along an edge of the other side of the substrate 21. Further, in order to increase the utilization of the light emitting cell, the light emitting area of the full-wave light emitting cells 50a and 50b may be larger than that of the half-wave light emitting cell.

In the present exemplary embodiment, the light emitting device may have a symmetrical surface structure with respect to a straight line parallel with horizontal edges of both sides and which traverses the center of the light emitting device. Further, the light emitting device may also have a symmetrical surface structure with respect to a straight line parallel with vertical edges of both sides and which traverses the center of the light emitting device.

Meanwhile, in order to prevent the lower semiconductor layer 25 and the upper semiconductor layer 29 in the light emitting cell from electrically shorting to each other by the wirings 37, the insulating layer (not shown) may be formed. The insulating layer covers the sides of the light emitting cells to insulate the wirings 37 from the light emitting cells. In addition, the wirings 37, the n-electrode 35, and the p-electrode 34 may be made of the same material by the same process. However, the wirings 37 formed between the light emitting cells may have a relatively greater width than the p-electrode 34 and the n-electrode 35, in order to improve the reliability thereof.

FIG. 16 is an equivalent circuit diagram of FIG. 14 for showing the light emitting device according to another exemplary embodiment of the present invention.

Referring to FIG. 16, when AC power is input to the first electrode pad 20a and the second electrode pad 20b, a forward voltage is applied to the first branch half-wave light emitting cells 30a and 30b, the full-wave light emitting cells 40a and 40b, and the first merge half-wave light emitting cell 30c and a reverse voltage is applied to the second branch half-wave light emitting cells 40a and 40b and the second merge half-wave light emitting cell 40c, for a half period of AC power. Therefore, current introduced through the first electrode pad 20a flows by being divided along the current path provided by the first branch half-wave light emitting cells 30a and 30b, which is in turn merged into the first merge half-wave light emitting cell 30c via the full-wave light emitting cells 50a and 50b.

Meanwhile, a reverse voltage is applied to the first branch half-wave light emitting cells 30a and 30b, the full-wave light emitting cells 40a and 40b, and the first merge half-wave light emitting cell 30c and a forward voltage is applied to the second branch half-wave light emitting cells 40a and 40b and the second merge half-wave light emitting cell 40c, for the other half period of AC power. Therefore, current introduced through the second electrode pad 20b flows by being divided along the current path provided by the second branch half-wave light emitting cells 40a and 40b, which is in turn merged into the second merge half-wave light emitting cell 40c via the full-wave light emitting cells 50a and 50b.

According to the present exemplary embodiment, the utilization of the light emitting cell may be increased at the time of AC driving by employing the half-wave light emitting cell and the full-wave light emitting cell. Further, since a reverse voltage applied to one light emitting cell has a similar magnitude to the sum of forward voltage applied to two light emitting cells, it is thereby possible to prevent the reverse voltage from becoming excessively increased and the light emitting cell from being broken. In addition, a large number of light emitting cells may be driven under a low driving voltage by providing the branched current path.

Figure 17:
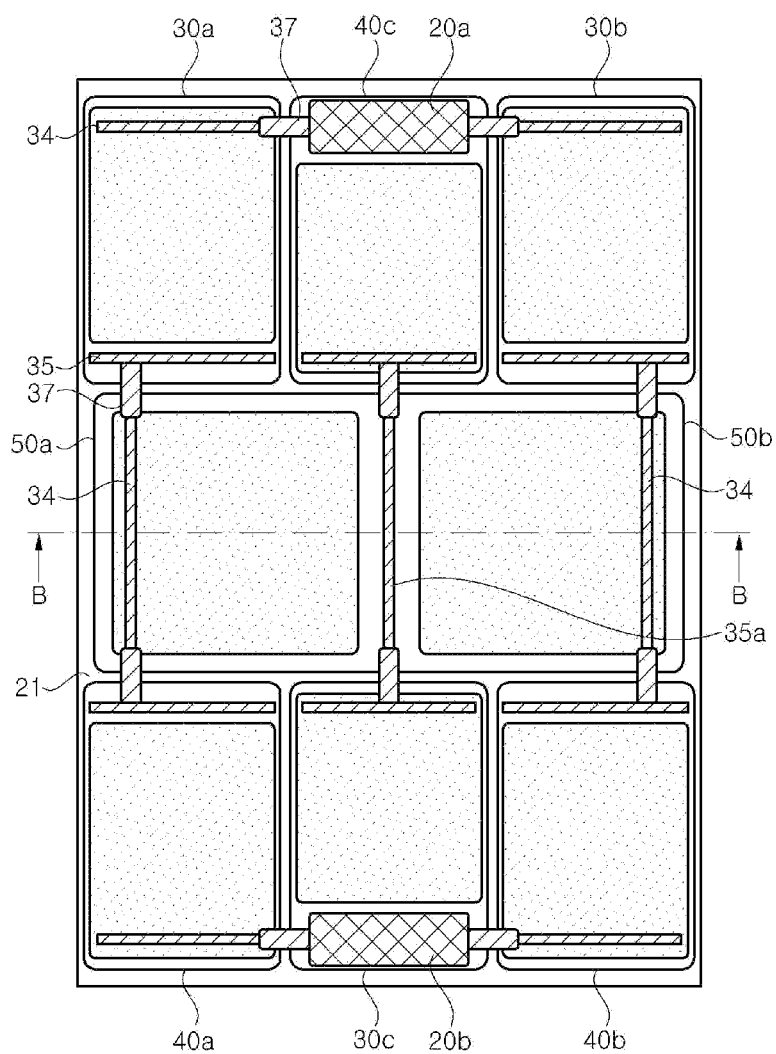
FIG. 17 is a schematic plan view showing a light emitting device according to an exemplary embodiment of the present invention.
Figure 18:
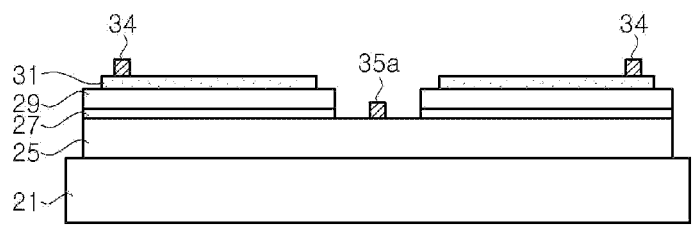
FIG. 18 is a cross-sectional view taken along line A-A of the light emitting device shown in FIG. 17.

FIG. 17 is a plan view showing a light emitting device according to another exemplary embodiment of the present invention and FIG. 18 is a cross-sectional view taken along line B-B of the light emitting device shown in FIG. 17.

Referring to FIG. 17 and FIG. 18, the light emitting device according to the present exemplary embodiment is substantially similar to the light emitting device described with reference to FIG. 14, FIG. 15, and FIG. 16 but is different in that the full-wave light emitting cells 50a and 50b share an n-electrode 35a. In other words, as shown in FIG. 18, the full-wave light emitting cell 50a and the full-wave light emitting cell 50b share the lower semiconductor layer 25 and share the n-electrode 35a disposed on the lower semiconductor layer 25.

Since the full-wave light emitting cells 50a and 50b share the lower semiconductor layer 25, they do not need to be separate from each other by etching the lower semiconductor layer 25 and the number of n-electrodes 35a may be reduced as compared to the light emitting device of FIG. 16. Therefore, the utilization of the light emitting cell may be further increased by making the area of the full-wave light emitting cells 50a and 50b relatively larger.

Figure 19:
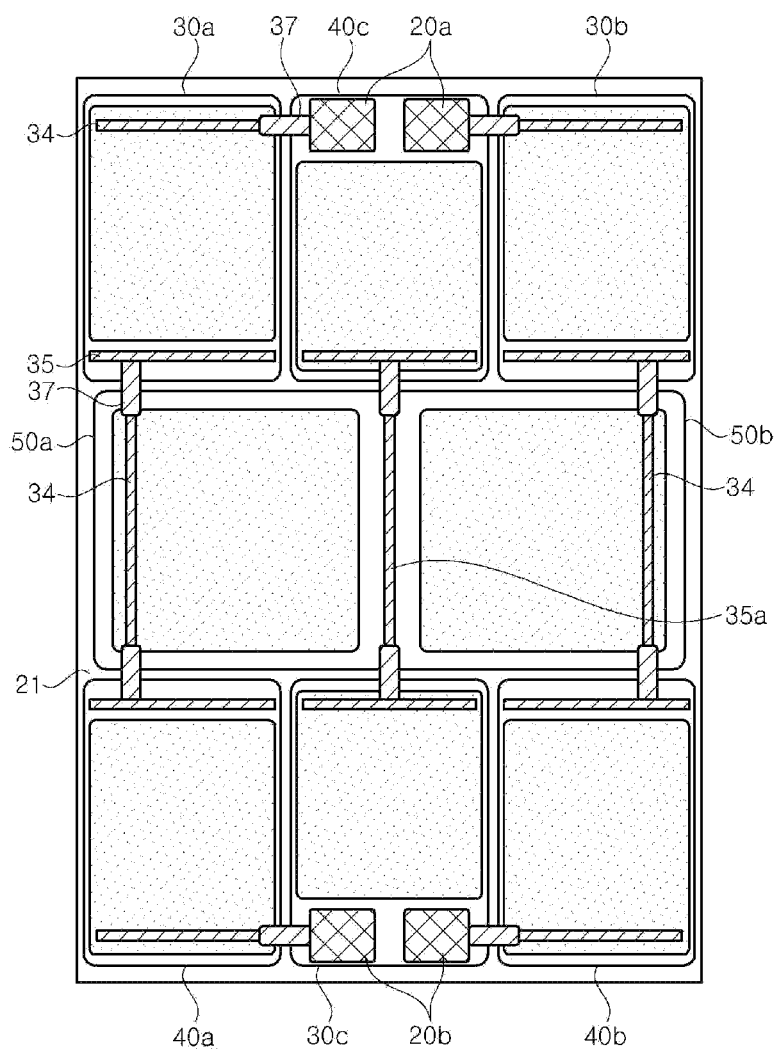
FIG. 19 is a schematic plan view showing a light emitting device according to an exemplary embodiment of the present invention.

FIG. 19 is a plan view showing a light emitting device according to another exemplary embodiment of the present invention.

Referring to FIG. 19, the light emitting device is substantially similar to the light emitting device described with reference to FIG. 17, but is different in that the first electrode pad 20a and the second electrode pad 20b are each configured to include two electrode pads.

The two first electrode pads 20a are disposed on the lower semiconductor layer 25 of the second merge half-wave light emitting cell 40c and are each connected to the first branch half-wave light emitting cells 30a and 30b, respectively. In addition, the two second electrode pads 20b are disposed on the lower semiconductor layer 25 of the first merge half-wave light emitting cell 30c and are each connected to the second branch half-wave light emitting cells 40a and 40b, respectively. An n-electrode (not shown) connecting the electrode pads 20a or 20b may be further formed.

The number of wires connecting light emitting cells in the present exemplary embodiment may be increased by configuring the first electrode pads 20a and the second electrode pads 20b as two separate electrode pads each. Therefore, the current introduced into the light emitting diode may be effectively distributed throughout the light emitting diode, and may mitigate the effect of bonding defects of the wires, thereby making it possible to improve the reliability of the device.

Figure 20:
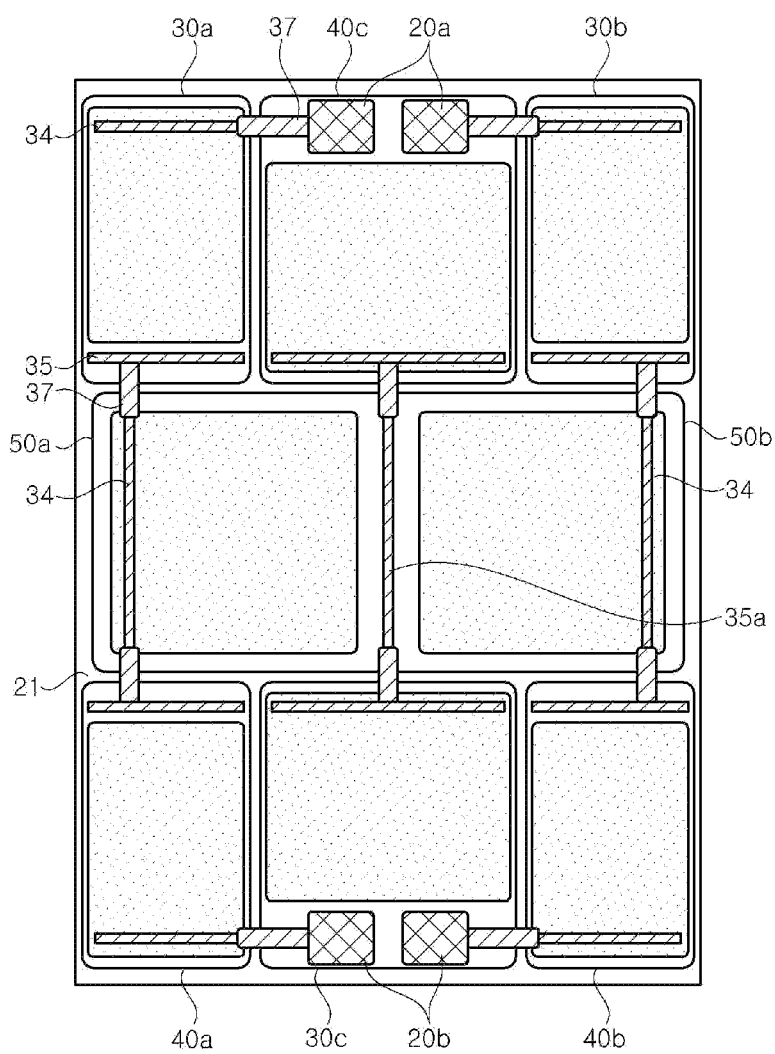
FIG. 20 is a schematic plan view showing a light emitting device according to an exemplary embodiment of the present invention.

Referring to FIG. 20, the light emitting device is substantially similar to the light emitting device described with reference to FIG. 19 but is different in the relative light emitting area of the branch half-wave light emitting cells 30a, 30b, 40a, and 40b and the merge half-wave light emitting cells 30c and 40c.

That is, the first branch half-wave light emitting cells 30a and 30b have substantially the same light emitting area and each has a smaller light emitting area than the light emitting area of the first merge half-wave light emitting cell 30c. The light emitting areas of each of the first branch half-wave light emitting cells 30a and 30b may be about ½ of that of the first merge half-wave light emitting cell 30c.

In addition, the second branch half-wave light emitting cells 40a and 40b have substantially the same light emitting area and each has a smaller light emitting area than the light emitting area of the second merge half-wave light emitting cell 40c. The light emitting areas of each of the second branch half-wave light emitting cells 40a and 40b may be about ½ of that of the first merge half-wave light emitting cell 40c.

Further, the first branch half-wave light emitting cells 30a and 30b have substantially the same area as the second branch half-wave light emitting cells 40a and 40b, and the first merge half-wave light emitting cell 30c may have substantially the same light emitting area as the second merge half-wave light emitting cell 40c.

A difference in current density between the branch half-wave light emitting cell and the merge half-wave light emitting cell may be reduced by making the light emitting area of the branch half-wave light emitting cell smaller than that of the merge half-wave light emitting cell.

Figure 21:
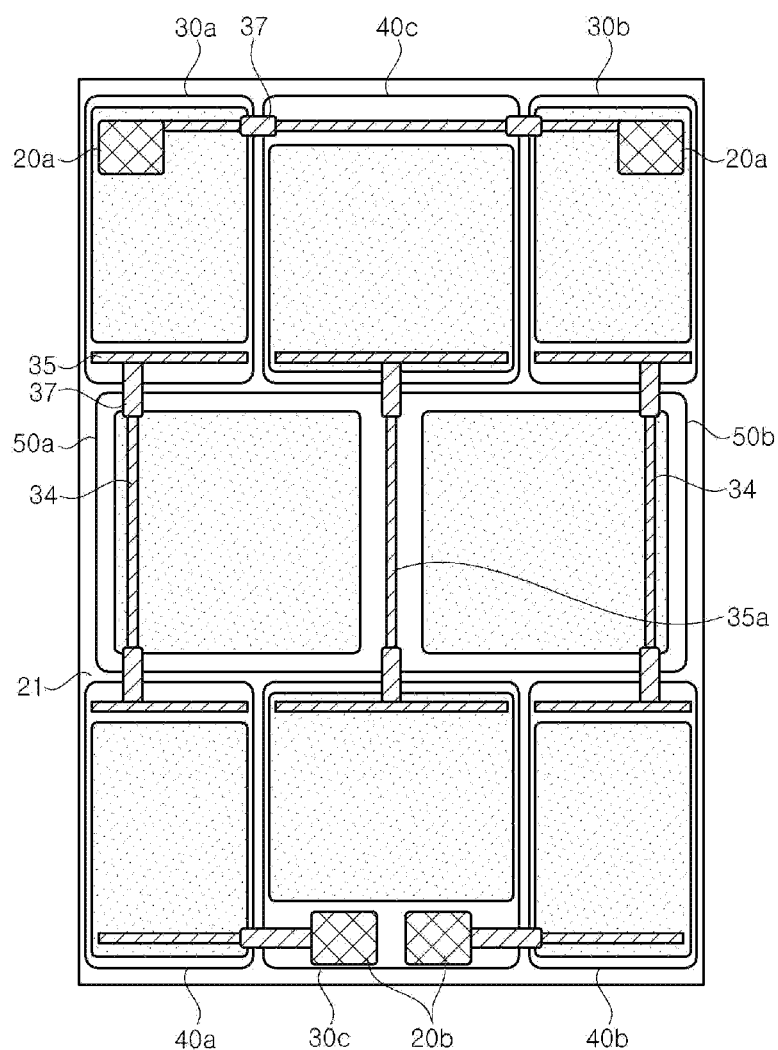
FIG. 21 is a schematic plan view showing a light emitting device according to an exemplary embodiment of the present invention.

FIG. 21 is a plan view showing a light emitting device according to another exemplary embodiment of the present invention.

Referring to FIG. 21, the light emitting device according to the present exemplary embodiment is similar to the light emitting device described with reference to FIG. 20, but is different in that the two first electrode pads 20a are each disposed on the first branch half-wave light emitting cells 30a and 30b.

That is, one of the first electrode pads 20a is disposed on the upper semiconductor layer 29 or the transparent electrode layer 31 of the first branch half-wave light emitting cell 30a and the other is disposed on the upper semiconductor layer 29 or the transparent electrode layer 31 of the first branch half-wave light emitting cell 30b. Therefore, the wire bonding process may be easily performed compared to the wire bonding process for the light emitting device shown in FIG. 20 by separating the two first electrode pads 20a from each other.

Figure 22:
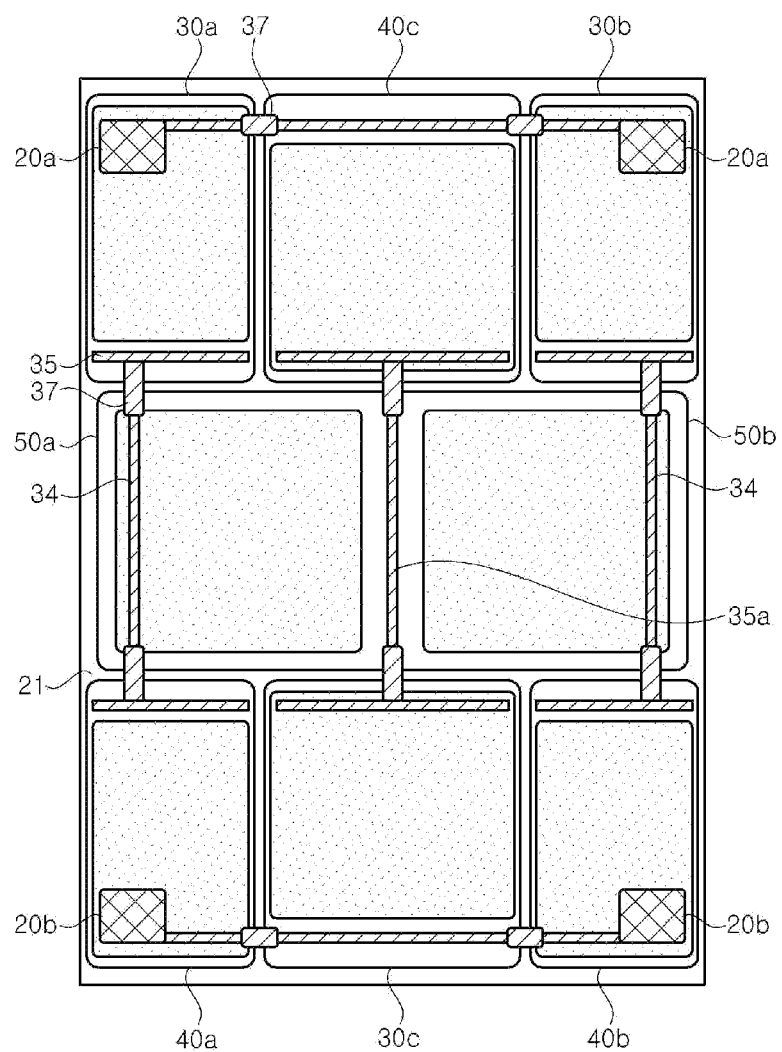
FIG. 22 is a schematic plan view showing a light emitting device according to an exemplary embodiment of the present invention.

Further, as shown in FIG. 22, the two second electrode pads 20b may each be disposed on the second branch half-wave light emitting cells 40a and 40b.

Figure 23:
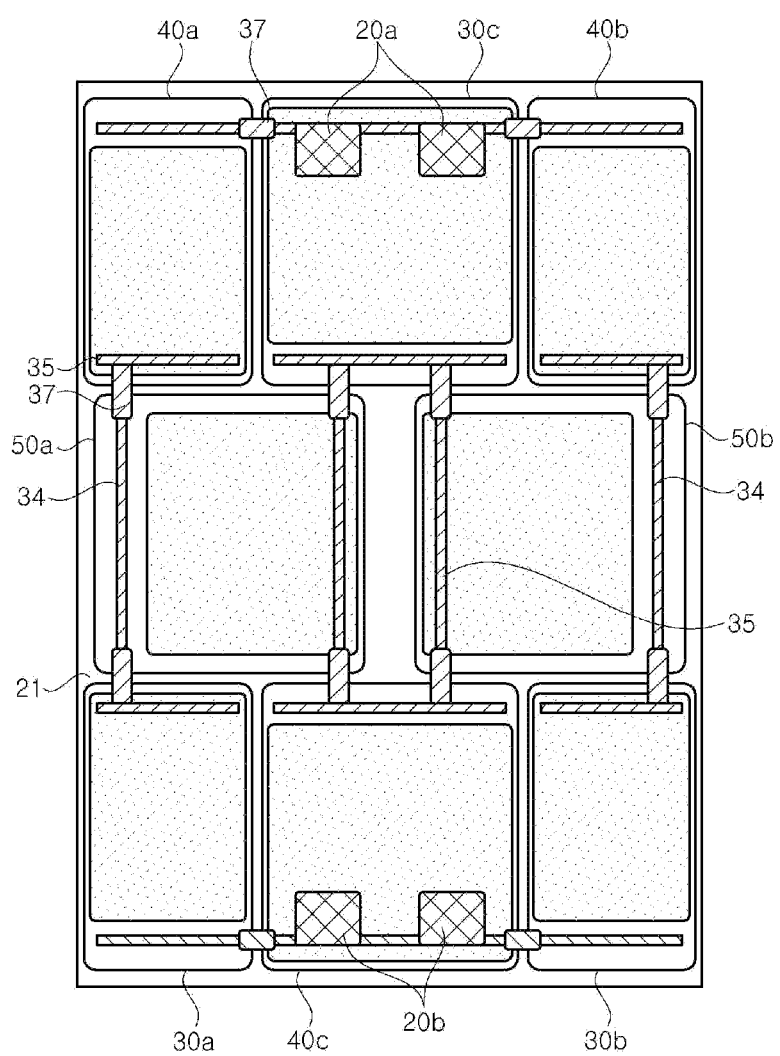
FIG. 23 is a schematic plan view showing a light emitting device according to an exemplary embodiment of the present invention.
Figure 24:
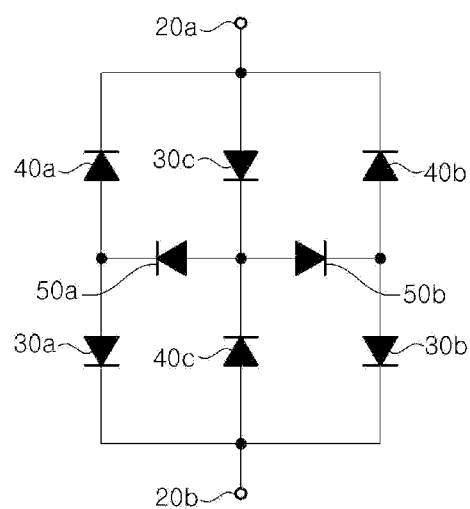
FIG. 24 is an equivalent circuit diagram of the light emitting device shown in FIG. 23.

FIG. 23 is a plan view showing a light emitting device according to another exemplary embodiment of the present invention, and FIG. 24 is an equivalent circuit diagram of the light emitting device shown in FIG. 23.

Referring to FIG. 23, the light emitting device according to the present exemplary embodiment is different, as compared with the light emitting device described with reference to FIG. 14, in that the first electrode pad 20a and the second electrode pad 20b are formed on a different semiconductor layer.

That is, in the present exemplary embodiment, the first electrode pad 20a is disposed on the upper semiconductor layer 29 of the first merge half-wave light emitting cell 30c and the second electrode pad 20b is disposed on the upper semiconductor layer 29 of the second merge half-wave light emitting cell 40c. The two first electrode pads 20a may be disposed on the upper semiconductor layer 29 of the first merge half-wave light emitting cell 30c and may be connected to each other by the p-electrode. In addition, the two second electrode pads 20a may be disposed on the upper semiconductor layer 29 of the second merge half-wave light emitting cell 40c and may be connected to each other by the p-electrode.

Meanwhile, the n-electrodes of the first branch half-wave light emitting cells 30a and 30b are each connected to the second electrode pad 20b and the n-electrodes of the second branch half-wave light emitting cells 40a and 40b are each connected to the first electrode pad 20a. In addition, the p-electrodes of the first branch half-wave light emitting cells 30a and 30b are each connected to the n-electrodes of the full-wave light emitting cells 50a and 50b and the p-electrodes of the second branch half-wave light emitting cells 40a and 40b are also connected to the n-electrodes of the full-wave light emitting cells 50a and 50b, respectively. Further, the p-electrode of the full-wave light emitting cell 50a and the p-electrode of the full-wave light emitting cell 50b are connected to the n-electrode of the first merge half-wave light emitting cell 30c and the n-electrode of the second merge half-wave light emitting cell 40c, respectively.

As shown in FIG. 24, the current introduced through the first electrode pad 20a is branched into the full-wave light emitting cells 50a and 50b via the first merge half-wave light emitting cell 30c. In addition, the current flowing through each full-wave light emitting cells 50a and 50b flows into the second electrode pad 20b via the first branch half-wave light emitting cells 30a and 30b.

In addition, the current introduced through the second electrode pad 20b is branched into the full-wave light emitting cells 50a and 50b via the second merge half-wave light emitting cell 40c. In addition, the current flowing through each full-wave light emitting cells 50a and 50b flows into the first electrode pad 20b via the second branch half-wave light emitting cells 40a and 40b.

That is, in the light emitting device according to the exemplary embodiment, the current introduced through the first electrode pad 20a or the second electrode pad 20b first passes through the merge half-wave light emitting cell, is branched into the full-wave light emitting cells 50a and 50b, and passes through the branch half-wave light emitting cells.

Figure 25:
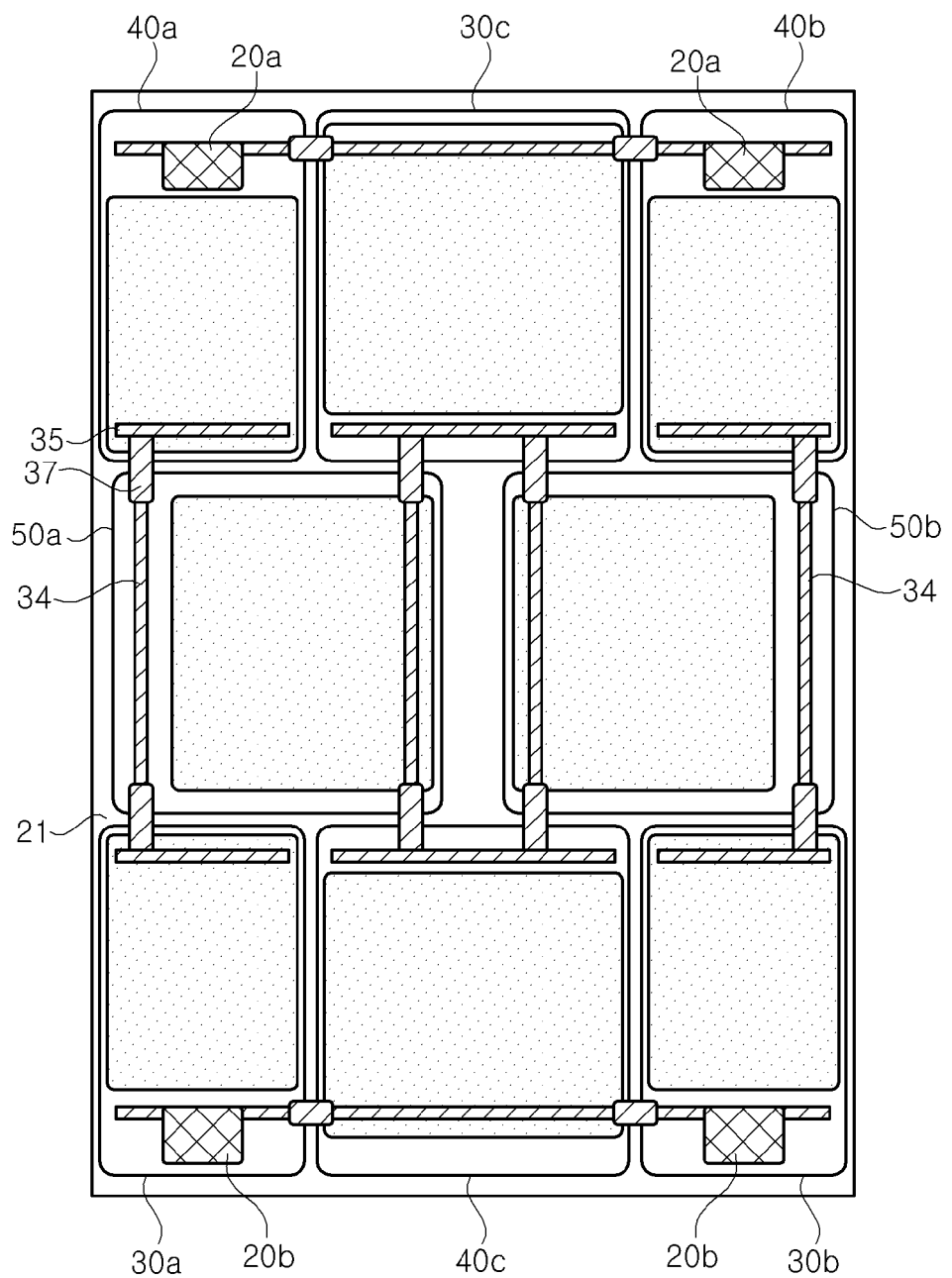
FIG. 25 is a schematic plan view showing a light emitting device according to an exemplary embodiment of the present invention.

FIG. 25 is a plan view for explaining a light emitting device according to another exemplary embodiment of the present invention.

Referring to FIG. 25, the light emitting device according to the present invention is substantially the same as the light emitting device described with reference to FIG. 23 but is different in that the first electrode pad 20a and the second electrode pad 20b are each disposed on the branch half-wave light emitting cells.

That is, the two first electrode pads 20a are each disposed on the lower semiconductor layers 25 of the second branch half-wave light emitting cells 40a and 40b and the two second electrode pads 20b are each disposed on the lower semiconductor layers 25 of the first branch half-wave light emitting cells 30a and 30b.

Meanwhile, the first electrode pads 20a are each connected to the p-electrode of the first merge half-wave light emitting cell 30c and the second electrode pads 20b are each connected to the p-electrode of the second merge half-wave light emitting cell 40c. Therefore, the electrode pads 20a and 20b may be formed to be spaced apart from each other.

Figure 26:
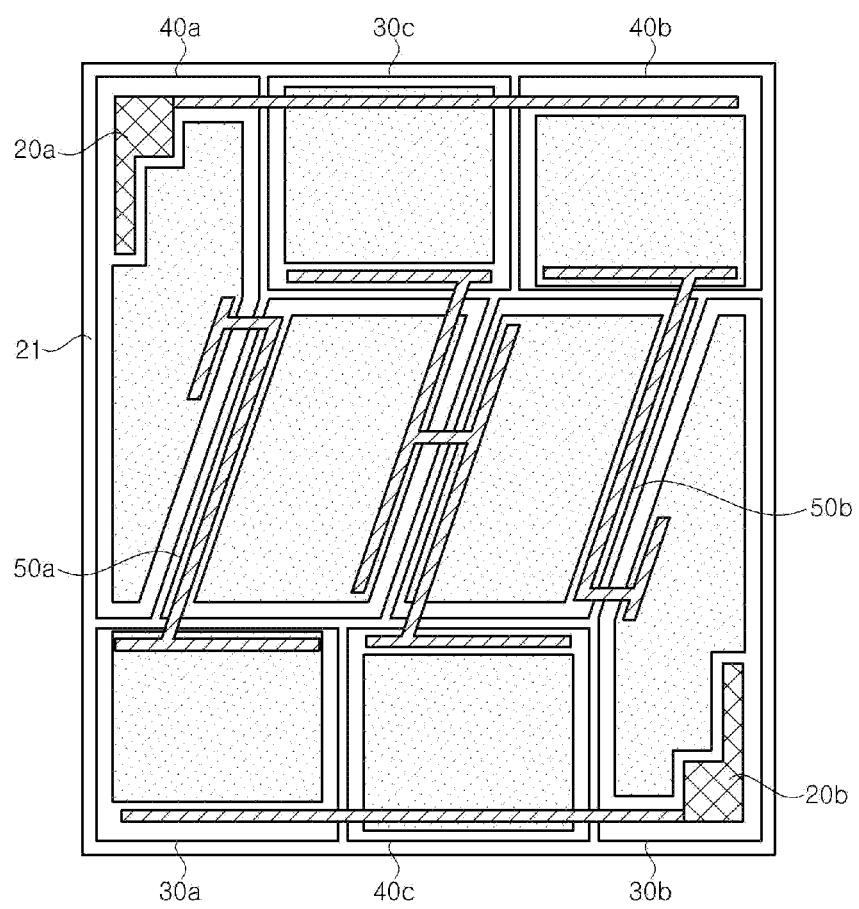
FIG. 26 is a schematic plan view showing a light emitting device according to an exemplary embodiment of the present invention.

FIG. 26 is a plan view showing a light emitting device according to another exemplary embodiment of the present invention.

Referring to FIG. 26, the first electrode pad 20a is disposed on the lower semiconductor layer 25 of the second branch half-wave light emitting cells 40a and the second electrode pad 20b are disposed on the lower semiconductor layer 25 of the first branch half-wave light emitting cell 30b. For example, the first electrode pad 20a may be disposed on the second branch half-wave light emitting cell disposed near an edge of one side of the substrate 21 and the second electrode pad 20b may be disposed on the first branch half-wave light emitting cell 30b disposed near an edge opposite to the edge of one side of the substrate 21.

Meanwhile, the first merge half-wave light emitting cell 30c is disposed between the second branch half-wave light emitting cell 40a and the second branch half-wave light emitting cell 40b along an edge of one side thereof. In addition, the second merge half-wave light emitting cell 40c is disposed between the second branch half-wave light emitting cell 30b and the second branch half-wave light emitting cell 30a along an edge of the other side thereof. The branch half-wave light emitting cells 40a and 30b on which the electrode pads 20a and 20b are disposed may have a substantially trapezoidal shape.

The first electrode pad 20a is connected to the upper semiconductor layer 29 (or p-electrode) of the first merge half-wave light emitting cell 30c and the lower semiconductor layer 25 (or n-electrode) of the second branch half-wave light emitting cell 40b. Meanwhile, the second electrode pad 20b is connected to the upper semiconductor layer 29 (or p-electrode) of the second merge half-wave light emitting cell 40c and the lower semiconductor layer 25 (or n-electrode) of the first branch half-wave light emitting cell 30a.

Meanwhile, the full-wave light emitting cells 50a and 50b are disposed in the area surrounded by the half-wave light emitting cells 30a, 30b, 30c, 40a, 40b, and 40c. The full-wave light emitting cells 50a and 50b may have a parallelogram shape.

In addition, the p-electrode of the full-wave light emitting cell 50a is connected to the n-electrode of the first merge half-wave light emitting cell 30c and the n-electrode of the second merge half-wave light emitting cell 40c and the n-electrode of the full-wave light emitting cell 50a is connected to the p-electrode of the second branch half-wave light emitting cell 40a and the p-electrode of the first branch half-wave light emitting cell 30a. In addition, the p-electrode of the full-wave light emitting cell 50b is connected to the n-electrode of the first merge half-wave light emitting cell 30c and the n-electrode of the second merge half-wave light emitting cell 40c and the n-electrode of the full-wave light emitting cell 50b is connected to the p-electrode of the first branch half-wave light emitting cell 30b and the p-electrode of the second branch half-wave light emitting cell 40b. The p-electrode of the full-wave light emitting cell 50a may be connected to the n-electrode of the second merge half-wave light emitting cell 40c through the p-electrode of the full-wave light emitting cell 50b and the p-electrode of the full-wave light emitting cell 50b may be connected to the n-electrode of the first merge half-wave light emitting cell 30c through the p-electrode of the full-wave light emitting cell 50a.

According to the present exemplary embodiment, the light emitting device connected to the circuit such as the equivalent circuit diagram shown in FIG. 24 may be provided.

Figure 27:
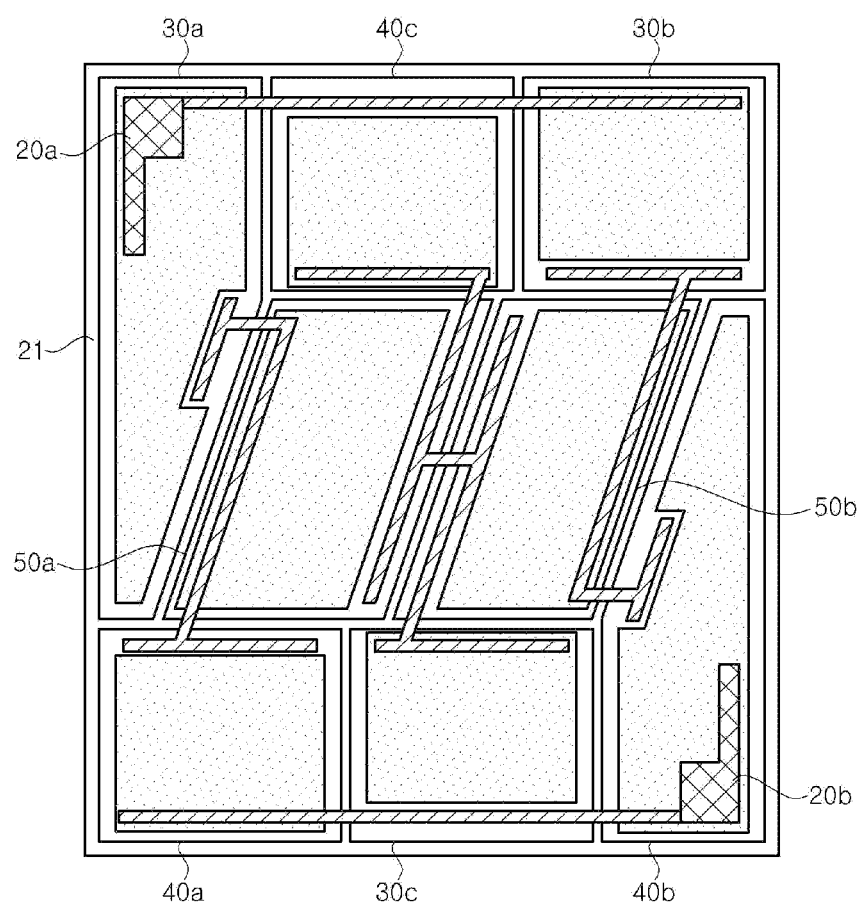
FIG. 27 is a schematic plan view showing a light emitting device according to an exemplary embodiment of the present invention.

FIG. 27 is a plan view showing a light emitting device according to another exemplary embodiment of the present invention. As compared to the light emitting device described with reference to FIG. 26, in the light emitting device according to the present exemplary embodiment, the arrangement of the n-electrode and the p-electrode of the light emitting cell are formed in reverse.

That is, referring to FIG. 27, the first electrode pad 20a is disposed on the upper semiconductor layer 29 of the first branch half-wave light emitting cell 30a and the second electrode pad 20b is disposed on the upper semiconductor layer 29 of the second branch half-wave light emitting cell 40b. For example, the first electrode pad 20a may be disposed on the first branch half-wave light emitting cell 30a disposed near an edge of one side of the substrate 21 and the second electrode pad 20b may be disposed on the second branch half-wave light emitting cell 40b disposed near an edge opposite to the edge of one side thereof.

Meanwhile, the second merge half-wave light emitting cell 40c is disposed between the first branch half-wave light emitting cell 30a and the first branch half-wave light emitting cell 30b along an edge of one side thereof. In addition, the first merge half-wave light emitting cell 30c is disposed between the second branch half-wave light emitting cell 40b and the second branch half-wave light emitting cell 40a along an edge of the other side thereof. The branch half-wave light emitting cells 30a and 40b on which the electrode pads 20a and 20b are disposed may substantially have a trapezoid shape.

The first electrode pad 20a is connected to the lower semiconductor layer 25 (or n-electrode) of the second merge half-wave light emitting cell 40c and the upper semiconductor layer 29 (or p-electrode) of the first branch half-wave light emitting cell 30b. Meanwhile, the second electrode pad 20b is connected to the lower semiconductor layer 25 (or n-electrode) of the first merge half-wave light emitting cell 30c and the upper semiconductor layer 29 (or p-electrode) of the second branch half-wave light emitting cell 40a.

Meanwhile, the full-wave light emitting cells 50a and 50b are disposed in the area surrounded by the half-wave light emitting cells 30a, 30b, 30c, 40a, 40b, and 40c, wherein the full-wave light emitting cells 50a and 50b may have a parallelogram shape.

In addition, the n-electrode of the full-wave light emitting cell 50a is connected to the p-electrode of the first merge half-wave light emitting cell 30c and the p-electrode of the second merge half-wave light emitting cell 40c and the p-electrode of the full-wave light emitting cell 50a is connected to the n-electrode of the second branch half-wave light emitting cell 40a and the n-electrode of the first branch half-wave light emitting cell 30a. Further, the n-electrode of the full-wave light emitting cell 50b is connected to the p-electrode of the first merge half-wave light emitting cell 30c and the p-electrode of the second merge half-wave light emitting cell 40c and the p-electrode of the full-wave light emitting cell 50b is connected to the n-electrode of the first branch half-wave light emitting cell 30b and the n-electrode of the second branch half-wave light emitting cell 40b. The n-electrode of the full-wave light emitting cell 50a may be connected to the p-electrode of the first merge half-wave light emitting cell 30c through the n-electrode of the full-wave light emitting cell 50b and the n-electrode of the full-wave light emitting cell 50b may be connected to the p-electrode of the first merge half-wave light emitting cell 40c through the n-electrode of the full-wave light emitting cell 50a.

According to the present exemplary embodiment, the light emitting device connected to the circuit such as the equivalent circuit diagram shown in FIG. 16 may be provided.

Figure 28:
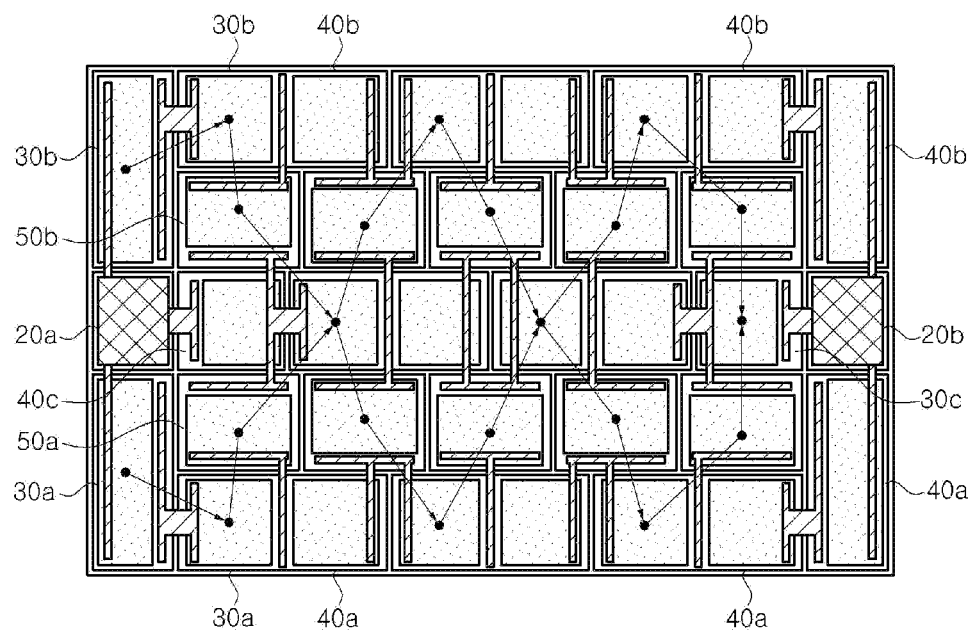
FIG. 28 is a schematic plan view showing a light emitting device according to an exemplary embodiment of the present invention.
Figure 29:
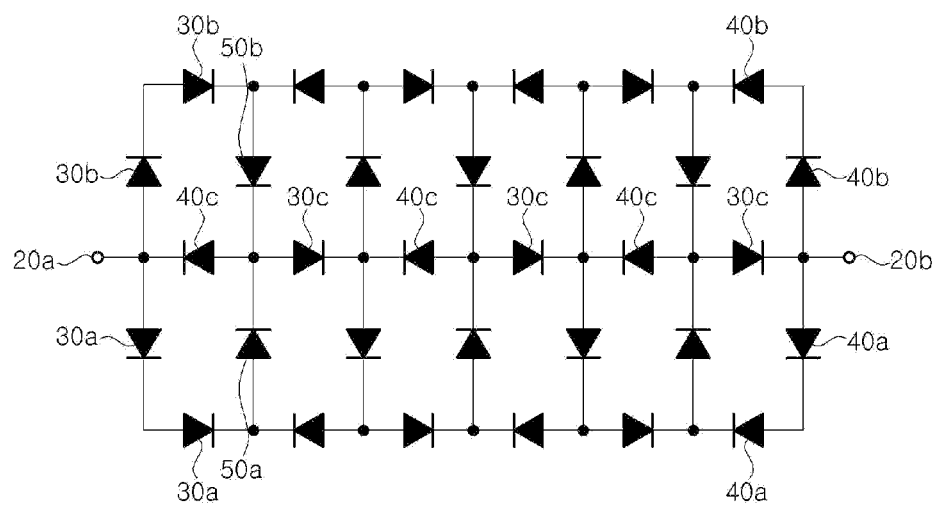
FIG. 29 is an equivalent circuit diagram of the light emitting device shown in FIG. 28.

FIG. 28 is a plan view showing a light emitting device according to another exemplary embodiment of the present invention, and FIG. 29 is an equivalent circuit diagram of the light emitting device shown in FIG. 28.

Referring to FIG. 28, the first electrode pad 20a is disposed near the center of an edge of one side of the substrate 21 and the second electrode pad 20b is disposed near the center of an edge of the other side of the substrate 21. The first and second pads 20a and 20b may be formed on the substrate 21, the lower semiconductor layer 25, or the upper semiconductor layer 29.

The first branch light emitting cells 30a and 30b may each be disposed at both sides of the first electrode pad 20a along an edge of one side of the substrate 21 and the second branch half-wave light emitting cells 40a and 40b may each be disposed at both sides of the second electrode pad 20b along an edge of the other side of the substrate 21. The first electrode pad 20a is connected to the p-electrodes of the first branch half-wave light emitting cells 30a and 30b and the second electrode pad 20b is connected to the p-electrode of the second branch half-wave light emitting cells 40a and 40b.

The first branch half-wave light emitting cells 30a and 30b may be electrically connected to the first branch half-wave light emitting cells 30a and 30b again. That is, the n-electrode of the first branch half-wave light emitting cell 30a connected to the first electrode pad 20a may be connected to the p-electrode of the first branch half-wave light emitting cell 30a and the n-electrode of the first branch half-wave light emitting cell 30b connected to the first electrode pad 20a may be connected to the p-electrode of the first branch half-wave light emitting cell 30b. Then, as described with reference to FIG. 14, the n-electrodes of the first branch half-wave light emitting cells 30a and 30b are connected to the p-electrode of the full-wave light emitting cells 50a and 50b and the n-electrodes of the full-wave light emitting cells 50a and 50b are connected to the p-electrode of the first merge half-wave light emitting cell 30c. As described with reference to FIG. 23, the n-electrode of the first merge half-wave light emitting cell 30c is connected to the p-electrode of the full-wave light emitting cells 50a and 50b and the n-electrodes of the full-wave light emitting cells 50a and 50b are connected to the p-electrodes of the first branch half-wave light emitting cell 30a and 30b.

The second branch half-wave light emitting cells 40a and 40b connected to the second electrode pad 20b each are electrically connected to the second branch half-wave light emitting cell and the other second branch half-wave light emitting cells 40a and 40b and the second merge half-wave light emitting cells 40c are connected to the first electrode pad 20a in the order mentioned above with respect to the first branch half-wave light emitting cells 30a and 30b.

According to the present exemplary embodiment, the light emitting device having the structure where the circuit shown in FIG. 16 and the circuit shown in FIG. 24 are connected by overlapping with each other is provided, wherein the case where the current path flows by being divided into two and is merged in one merge half-wave light emitting cell is repeated. An arrow shown in the drawings represents the current path along which current flows by applying a forward voltage for a half period of AC power. In this case, the light emitting cells emitting light is represented by a point.

As shown in FIG. 28, the first merge half-wave light emitting cells 30c and the second merge half-wave light emitting cells 40c may be alternately disposed between the first electrode pad 20a and the second electrode pad 20b. Further, as shown in FIG. 28, the light emitting device according to the present invention may have a symmetrical surface structure with respect to the straight line parallel with horizontal edges of both sides and which traverses the center of the light emitting device. Further, the light emitting device may also have a symmetrical surface structure with respect to a straight line parallel with vertical edges of both sides and which traverses the center of the light emitting device.

In addition, in the exemplary embodiments disclosed above, the first branch half-wave light emitting cells 30a or 30b and the second branch half-wave light emitting cells 40b or 40a may be disposed to be adjacent to each other and may share an n-electrode. Further, the first merge half-wave light emitting cell 30c and the second merge half-wave light emitting cell 40c, which are adjacent to each other, may share an n-electrode.

According to the present invention, a light emitting diode having a smaller number of light emitting cells may be used compared to the related art and providing substantially the same amount of light by increasing the utilization of the light emitting cells therein, thereby making it possible to provide a light emitting device with improved productivity and cost savings.

Further, according to the present invention, the possibility of damaging the light emitting diode may be reduced by minimizing the reverse voltage applied to a single light emitting cell therein, thereby making it possible to promote the stability of the light emitting device against the reverse voltage.

Further, the number of light emitting cells driven under the specific driving voltage may be increased compared to the related art.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting device, comprising:
at least three pairs of half-wave light emitting units, each pair comprising a terminal of a first half-wave light emitting unit connected to a terminal of a second half-wave light emitting unit, the terminals comprising the same polarity, a polarity of the connected terminals of one half-wave light emitting unit pair being opposite to the polarity of the connected terminals of an adjacent half-wave light emitting unit pair;
at least two full-wave light emitting units each connected to adjacent pairs of half-wave light emitting units; and
a node connected to the at least two full-wave light emitting units and a first pair of half-wave light emitting units of the at least three pairs of half-wave light emitting units,
wherein:
the half-wave light emitting units and the full-wave light emitting units each comprise at least one light emitting cell;
the half-wave light emitting units each comprise a first terminal and a second terminal;
the full-wave light emitting units each comprise a third terminal comprising the same polarity as the first terminal and a fourth terminal comprising the same polarity as the second terminal;
the third terminal of each full-wave light emitting unit being connected to the second terminal of adjacent half-wave light emitting units and the fourth terminal of each full-wave light emitting unit being connected to the first terminal of adjacent half-wave light emitting units;
the two full-wave light emitting units are disposed on opposite sides of the node; and
each half-wave light emitting unit of the first pair of half-wave light emitting units is disposed on an opposite side of the node.

2. The light emitting device of claim 1, wherein end terminals of both sides of one pair of half-wave light emitting units are connected to end terminals of both sides of another pair half-wave light emitting units, respectively.

3. The light emitting device of claim 2, wherein the connected at least three pairs of half-wave light emitting units and the full-wave light emitting units comprise a first structure, and the first structure is provided in plural and the plurality of first structures are electrically connected to each other.

4. The light emitting device of claim 2, wherein there are three pairs of half-wave light emitting units and the two full-wave light emitting units.

5. The light emitting device of claim 1, further comprising:
a fourth pair of half-wave light emitting units, wherein end terminals of the fourth pair of half-wave light emitting units are connected to end terminals of the at least three pairs of half-wave light emitting units, and the end terminals of the fourth pair of half-wave light emitting units comprise the same polarity as end terminals of one pair of the at least three pairs of half-wave light emitting units;
a full-wave light emitting unit connected between the fourth pair of half-wave light emitting units and an adjacent pair of half-wave light emitting units.

6. The light emitting device of claim 5, further comprising:
a fifth pair of half-wave light emitting units, wherein end terminals of the fifth pair of half-wave light emitting units are connected to end terminals of the at least three pairs of half-wave light emitting units, and the end terminals of the fifth pair of half-wave light emitting units comprise the same polarity as end terminals of one pair of the at least three pairs of half-wave light emitting units;
a full-wave light emitting unit connected between the fifth pair of half-wave light emitting units and an adjacent pair of half-wave light emitting units.

7. A light emitting device, comprising:
a substrate;
at least one first electrode pad arranged on the substrate;
at least one second electrode pad arranged on the substrate;
a plurality of half-wave light emitting cells arranged on the substrate;
a plurality of full-wave light emitting cells arranged on the substrate;
a plurality of connectors electrically connecting the half-wave light emitting cells and the full-wave light emitting cells; and
a node having four of the connectors connected thereto, the node being connected to two full-wave light emitting units of the plurality of full-wave light emitting units and two half-wave light emitting units of the plurality of half-wave light emitting cells by the four connectors, respectively,
wherein:
the plurality of half-wave light emitting cells comprise at least two first branch half-wave light emitting cells and at least one first merge half-wave light emitting cell;
the plurality of full-wave light emitting cells each are electrically connected to the at least two first branch half-wave light emitting cells and the at least one first merge half-wave light emitting cell;
the at least two first branch half-wave light emitting cells, the at least one first merge half-wave light emitting cell, and the full-wave light emitting cells being configured to emit light during a first half period of alternating current (AC) power when an AC power is supplied to the first electrode pad and the second electrode pad;
the two full-wave light emitting units are disposed on opposite sides of the node; and
the two half-wave light emitting unit are disposed on opposite sides of the node.

8. The light emitting device of claim 7, wherein the plurality of half-wave light emitting cells further comprise at least two second branch half-wave light emitting cells and at least one second merge half-wave light emitting cell,
the plurality of full-wave light emitting cells each are electrically connected to the at least two second branch half-wave light emitting cells and the at least one second merge half-wave light emitting cell, and
the at least two second branch half-wave light emitting cells, the at least one second merge half-wave light emitting cell, and the full-wave light emitting cells being configured to emit light during a second half period of alternating current (AC) power when the AC power is supplied to the first electrode pad and the second electrode pad.

9. The light emitting device of claim 8, wherein the plurality of full-wave light emitting cells comprise a common light emitting cell sharing an n-electrode.

10. The light emitting device of claim 8, wherein a light emitting area of each of the at least two first branch half-wave light emitting cells is smaller than a light emitting area of the at least one first merge half-wave light emitting cell, and
a light emitting area of each of the at least two second branch half-wave light emitting cells is smaller than a light emitting area of the at least one second merge half-wave light emitting cell.

11. The light emitting device of claim 10, wherein the light emitting area of each of the at least two first branch half-wave light emitting cells is half as large as the light emitting area of the at least one first merge half-wave light emitting cell, and
the light emitting area of each of the at least two second branch half-wave light emitting cells is half as large as the light emitting area of the at least one second merge half-wave light emitting cell.

12. The light emitting device of claim 8, wherein the first electrode pad is arranged on the at least one second merge half-wave light emitting cell, the first electrode pad being arranged at an edge of a first side of the substrate, and
the second electrode pad is arranged on the at least one first merge half-wave light emitting cell, the second electrode pad being arranged at an edge of a second side of the substrate, the second side being opposite to the first side.

13. The light emitting device of claim 12, wherein at least one of the first electrode pad and the second electrode pad comprises two separate electrode pads.

14. The light emitting device of claim 12, wherein the at least two first branch half-wave light emitting cells are disposed on either side of the at least one second merge half-wave light emitting cell, the at least two first branch half-wave light emitting cells and the at least one second merge half-wave light emitting cell being arranged at an edge of the first side of the substrate, and
the at least two second branch half-wave light emitting cells are arranged on either side of the at least one first merge half-wave light emitting cell, the at least two second branch half-wave light emitting cells and the at least one first merge half-wave light emitting cell being arranged at an edge of the second side of the substrate.

15. The light emitting device of claim 14, wherein the full-wave light emitting cells are arranged between the half-wave light emitting cells arranged at the edge of the first side of the substrate and the half-wave light emitting cells arranged at the edge of the second side of the substrate.

16. The light emitting device of claim 8, wherein the first electrode pad is comprises two separate electrode pads, and
each of the two first electrode pads are respectively arranged on one of the at least two second branch half-wave light emitting cells arranged at the edge of the first side of the substrate.

17. The light emitting device of claim 16, wherein the second electrode pad is arranged on a first conductivity-type semiconductor layer of the at least one first merge half-wave light emitting cell arranged at an edge of the second side of the substrate.

18. The light emitting device of claim 17, wherein the second electrode pad comprises two separate electrode pads.

19. The light emitting device of claim 16, wherein each of the two second electrode pads are respectively arranged on one of the at least two first branch half-wave light emitting cells arranged at an edge of the second side of the substrate, the second side being opposite to the first side.

20. The light emitting device of claim 8, wherein the light emitting area of each of the full-wave light emitting cells is larger than the light emitting area of each of the half-wave light emitting cells.

21. The light emitting device of claim 20, wherein the light emitting area of each of the at least two first branch half-wave light emitting cells is smaller than the light emitting area of the at least one first merge half-wave light emitting cell, and
the light emitting area of each of the at least two second branch half-wave light emitting cells is smaller than the light emitting area of the at least one second merge half-wave light emitting cell.

22. The light emitting device of claim 8, wherein the full-wave light emitting cells comprises a substantially parallelogram shape.

23. The light emitting device of claim 22, wherein the first electrode pad is disposed on one of the at least two first branch half-wave light emitting cells arranged near an edge of a first side of the substrate, and
the second electrode pad is arranged on one of the at least two second branch half-wave light emitting cells arranged near an edge one of a second side of the substrate, the second side being opposite to the first side.

24. The light emitting device of claim 23, wherein the first branch half-wave light emitting cell and the second branch half-wave light emitting cell on which the first electrode pad and the second electrode pad are respectively arranged comprise a substantially trapezoidal shape.

25. The light emitting device of claim 22, wherein the first electrode pad is arranged on one of the at least two second branch half-wave light emitting cells arranged near an edge of a first side of the substrate, and
the second electrode pad is arranged on one of the at least two first branch half-wave light emitting cells arranged near an edge one of a second side of the substrate, the second side being opposite to the first side.

26. The light emitting device of claim 8, wherein the first electrode pad is arranged near an edge of a first side of the substrate;
the second electrode pad is arranged near an edge of the second side of the substrate, the second side being opposite to first side,
the at least two first branch half-wave light emitting cells are disposed on either side of the first electrode pad along an edge of the first side of the substrate, and
the at least two second branch half-wave light emitting cells are disposed on either side of the second electrode pad along an edge of the second side of the substrate.

27. The light emitting device of claim 26, wherein the at least two first branch half-wave light emitting cells arranged on either side of the first electrode pad each are connected to another first branch half-wave light emitting cell.

28. The light emitting device of claim 27, wherein the at least two second branch half-wave light emitting cells arranged on either side of the second electrode pad each are connected to another second branch half-wave light emitting cell.

29. The light emitting device of claim 26, wherein the at least one first merge half-wave light emitting cell and the at least one second merge half-wave light emitting cell are alternately arranged between the first electrode pad and the second electrode pad.

30. The light emitting device of claim 7, wherein the light emitting device comprises a symmetrical surface structure with respect to a straight line parallel with horizontal edges of both sides and which traverses the center of the light emitting device.

31. The light emitting device of claim 30, wherein the light emitting device also comprises a symmetrical surface structure with respect to a straight line parallel with vertical edges of both sides and which traverses the center of the light emitting device.

32. A light emitting device, comprising:
a first row comprising a first light emitting cell and a second light emitting cell;
a second row comprising a third light emitting cell and a fourth light emitting cell;
a third row comprising a fifth light emitting cell and a sixth light emitting cell; and
a first column comprising a seventh light emitting cell and an eighth light emitting cell,
wherein:
the seventh light emitting cell and the eighth light emitting cell are connected to the third light emitting cell and the fourth light emitting cell at a first node;
the third light emitting cell is disposed on an opposite side of the first node from the fourth light emitting cell; and
the seventh light emitting cell is disposed on an opposite side of the first node from the eighth light emitting cell.

33. The light emitting device of claim 32, wherein the first light emitting cell, the third light emitting cell, and the fifth light emitting cell are connected to each other at a second node, and
wherein the second light emitting cell, the fourth light emitting cell, and the sixth light emitting cell are connected to each other at a third node.

34. The light emitting device of claim 33, wherein the second light emitting cell, the third light emitting cell, the sixth light emitting cell, the seventh light emitting cell, and the eighth light emitting cell are configured to emit light during a first half period of alternating current (AC) power when an AC power is supplied to the second node and the third node.

35. The light emitting device of claim 33, wherein the first light emitting cell, the fourth light emitting cell, the fifth light emitting cell, the seventh light emitting cell, and the eighth light emitting cell are configured to emit light during a second half period of alternating current (AC) power when the AC power is supplied to the second node and the first node.

* * * * *